(12) United States Patent
Mauder et al.

(10) Patent No.: US 8,187,947 B2
(45) Date of Patent: May 29, 2012

(54) CAPACITOR STRUCTURE IN TRENCH STRUCTURES OF SEMICONDUCTOR DEVICES AND SEMICONDUCTOR DEVICES COMPRISING CAPACITOR STRUCTURES OF THIS TYPE AND METHODS FOR FABRICATING THE SAME

(75) Inventors: Anton Mauder, Kolbermoor (DE); Hans-Joachim Schulze, Ottobrunn (DE); Helmut Strack, Munich (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 12/827,035

(22) Filed: Jun. 30, 2010

(65) Prior Publication Data

US 2010/0264456 A1    Oct. 21, 2010

Related U.S. Application Data

(62) Division of application No. 11/223,210, filed on Sep. 12, 2005, now Pat. No. 7,795,660.

(30) Foreign Application Priority Data

Sep. 13, 2004  (DE) .................. 10 2004 044 619

(51) Int. Cl.
*H01L 21/02* (2006.01)

(52) U.S. Cl. ........ 438/387; 438/386; 438/396; 257/139; 257/532; 257/E21.018

(58) Field of Classification Search .................. 438/387, 438/386, 396, 397, 391; 257/139, 532
See application file for complete search history.

(56) References Cited

U.S. PATENT DOCUMENTS

| | | | |
|---|---|---|---|
| 4,513,350 A | 4/1985 | Coleman | |
| 4,685,197 A | 8/1987 | Tigelaar et al. | |
| 4,805,071 A | 2/1989 | Hutter et al. | |
| 5,998,833 A * | 12/1999 | Baliga ........................ 257/329 |
| 6,388,286 B1 | 5/2002 | Baliga | |
| 6,437,385 B1 | 8/2002 | Bertin et al. | |
| 6,573,558 B2 | 6/2003 | Disney | |
| 6,587,327 B1 | 7/2003 | Devoe et al. | |
| 6,608,350 B2 | 8/2003 | Kinzer et al. | |
| 6,677,641 B2 | 1/2004 | Kocon | |
| 7,173,306 B2 | 2/2007 | Hirler et al. | |
| 7,345,342 B2 | 3/2008 | Challa et al. | |
| 2003/0073287 A1 | 4/2003 | Kocon | |
| 2004/0063269 A1 | 4/2004 | Kocon | |
| 2005/0082591 A1 | 4/2005 | Hirler et al. | |
| 2005/0173758 A1 | 8/2005 | Peake et al. | |

FOREIGN PATENT DOCUMENTS

| | | |
|---|---|---|
| DE | 102004007196 A1 | 6/2005 |
| EP | 0188946 A1 | 7/1986 |
| EP | 1168455 A2 | 1/2002 |
| WO | 2005078802 A2 | 8/2005 |

* cited by examiner

*Primary Examiner* — Thinh T Nguyen

(74) *Attorney, Agent, or Firm* — Edell, Shapiro & Finnan, LLC

(57) ABSTRACT

A capacitor structure in trench structures of a semiconductor device includes conductive regions made of metallic and/or semiconducting materials. The conducting regions are surrounded by a dielectric and form stacked layers in the trench structure of the semiconductor device.

11 Claims, 14 Drawing Sheets

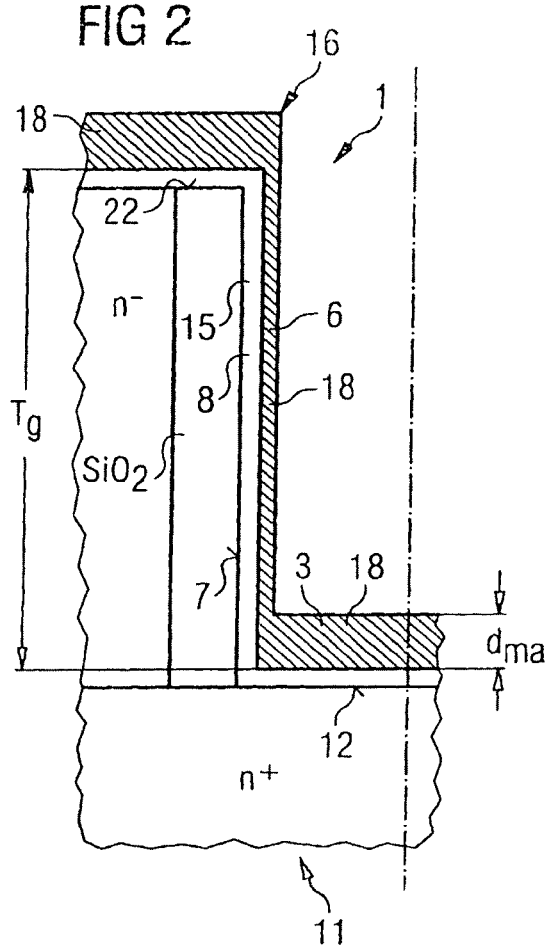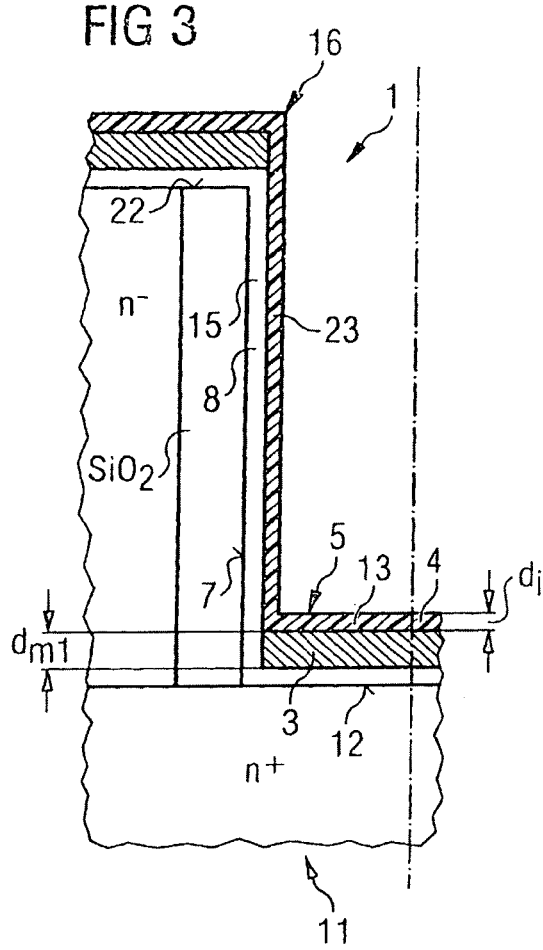

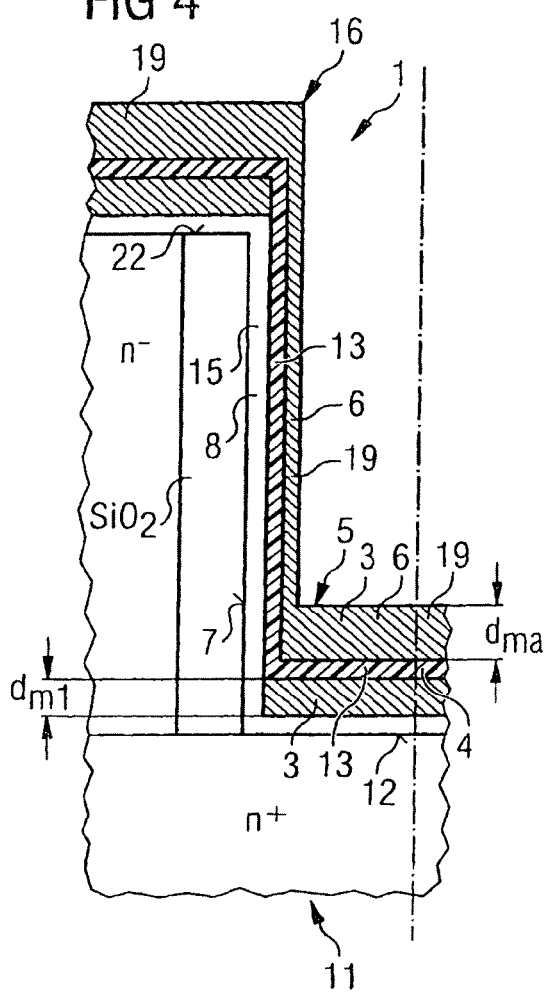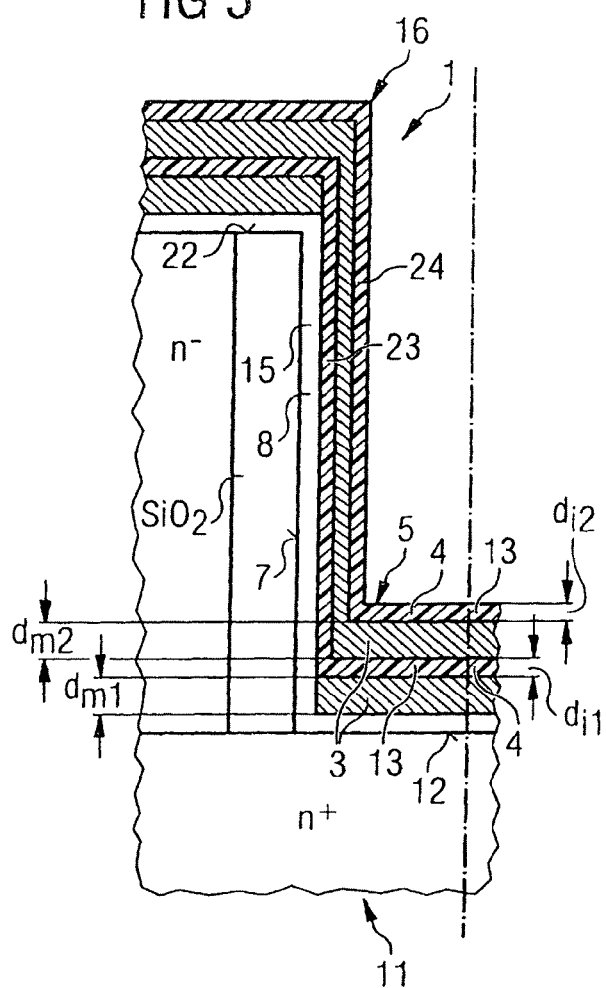

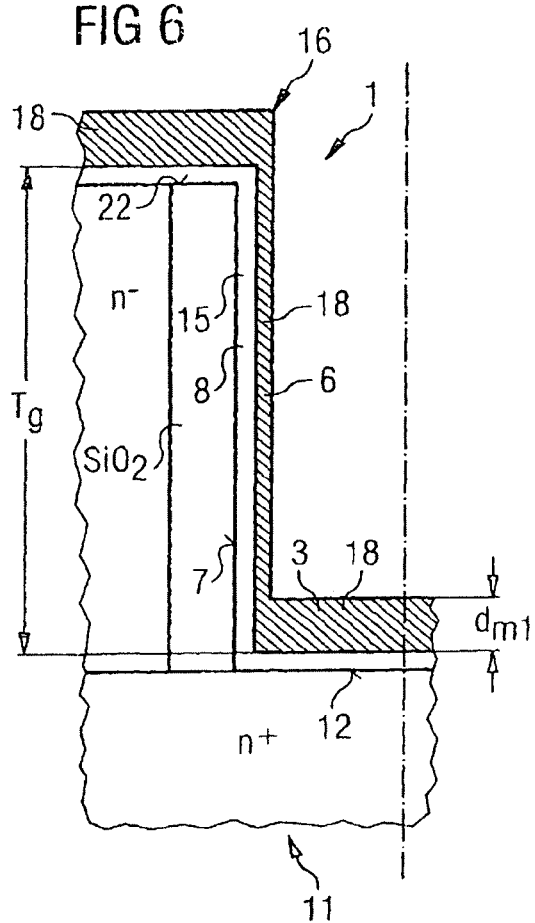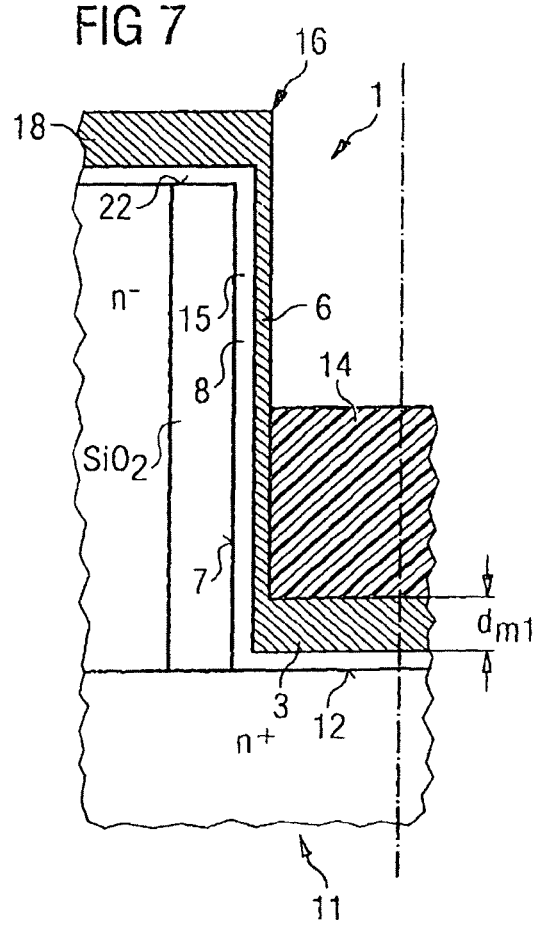

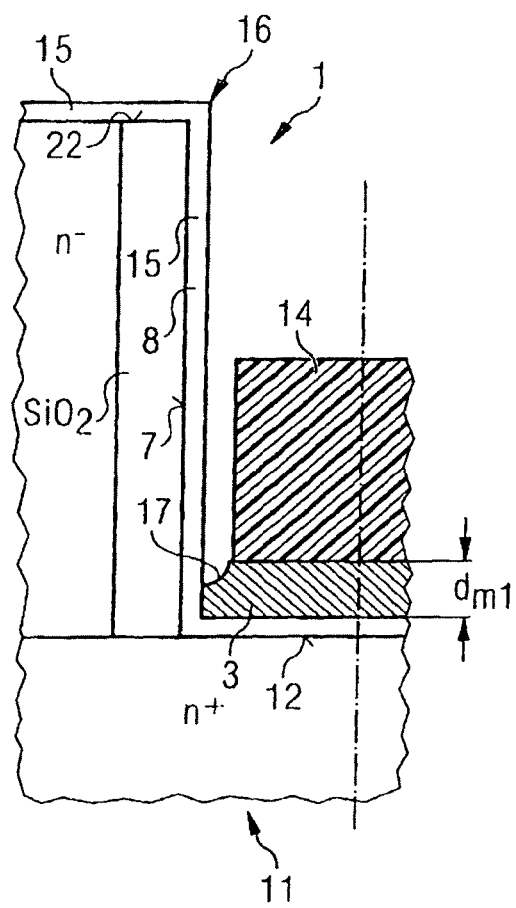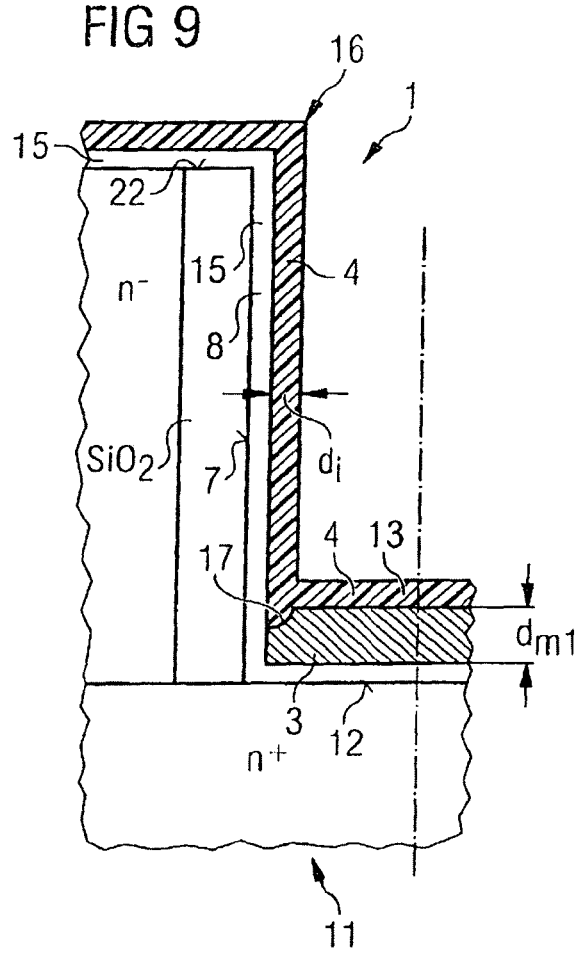

CAPACITOR STRUCTURE IN TRENCH STRUCTURES OF SEMICONDUCTOR DEVICES AND SEMICONDUCTOR DEVICES COMPRISING CAPACITOR STRUCTURES OF THIS TYPE AND METHODS FOR FABRICATING THE SAME

CROSS REFERENCE TO RELATED APPLICATIONS

This application is a divisional of U.S. patent application Ser. No. 11/223,210 filed Sep. 12, 2005, entitled "Capacitor Structure in Trench Structures of Semiconductor Devices and Semiconductor Devices Comprising Capacitor Structures of this Type and Methods for Fabricating the Same," which claims priority under 35 U.S.C. §119(a)-(d) to Application No. DE 102004044619.9-33 filed on Sep. 13, 2004, entitled "Capacitor Structure in Trench Structures of Semiconductor Devices and Semiconductor Devices Comprising Capacitor Structures of this Type and Methods for Fabricating the Same," the entire contents of each of which are hereby incorporated by reference.

FIELD OF THE INVENTION

The invention relates to a capacitor structure in trench structures of semiconductor devices and semiconductor devices comprising capacitor structures of this type.

BACKGROUND

In conventional MOSFETs, the maximum donor concentration $[N_D]$ in an $n^-$-type region and thus also the electrical conductivity of the $n^-$-type region are determined by the required locking capability, or vice versa. In the event of avalanche breakdown, approximately $1.5 \times 10^{12}$ cm$^{-2}$ donors are then ionized, the counter charge of which is found in the acceptor charge of the p-conducting region of the MOSFET structure. If a higher donor concentration is to be made possible, then counter charges for the donor atoms of the $n^-$-type region have to be found approximately in the same component plane. In the case of MOS field plate transistors comprising a trench structure such as are known from the document U.S. Pat. No. 6,573,558 B2, this takes place via the charge carriers of the field plate. In the case of compensation components, such as in the case of "CoolMOS", which have $n^-$-type regions and p-type regions arranged alternately in cells, this takes place via acceptors of the p-type regions as counter charges.

In this context, an $n^-$-type or $p^-$-type region is understood to be a region of a semiconductor component which is weakly doped and has a defect concentration $[N_D]$ or $[N_P]$, respectively, of between $$1 \times 10^{12} \text{ cm}^{-3} \leq ([N_D] \text{ or } [N_P]) \leq 1 \times 10^{17} \text{ cm}^{-3}$$

where $[N_D]$ is the donor concentration and $[N_P]$ is the acceptor concentration.

An n-type or p-type region is understood to be a region of a semiconductor component which is medium-doped and has a defect concentration of between $$1 \times 10^{17} \text{ cm}^{-3} \leq ([N_D] \text{ or } [N_P]) \leq 1 \times 10^{18} \text{ cm}^{-3}$$

An n+-type or p$^+$-type region is understood to be a region of a semiconductor component which is highly doped and has a defect concentration of between $$1 \times 10^{18} \text{ cm}^{-3} \leq ([N_D] \text{ or } [N_P]) \leq 1 \times 10^{20} \text{ cm}^{-3}$$

A metallically conducting semiconductor region is understood to be a region of a semiconductor component which has an extremely high doping and has a defect concentration of between $$1 \times 10^{20} \text{ cm}^{-3} \leq ([N_D] \text{ or } [N_P]) \leq 1 \times 10^{22} \text{ cm}^{-3}.$$

If the intention is to further improve the electrical conductivity of an $n^-$-type region in the case of compensation components such as e.g. "CoolMOS", then the degree of compensation has to be set more and more precisely. This is encountering the limits of technological feasibility even today. The MOS field plate transistors comprising a trench structure which are known from U.S. Pat. No. 673,558 B2 have the disadvantage that, depending on the type of connection of the field plate, the entire reverse voltage is dropped either at the source end or at the drain end with respect to the $n^-$-type region and very thick insulation layers are thus required. At a continuous loading of 600 V, approximately 6 μm thick SiO$_2$ would be required, which significantly reduces the effect of the field plate in providing counter charges.

Further semiconductor devices comprising trench structures are known from the document U.S. Pat. No. 6,608,350 B2. With trench structures of this type, it is possible to fabricate a high-voltage transistor having a low forward resistance on an n$^+$-conducting semiconductor substrate with a weakly doped semiconductor body region on the n$^+$-conducting semiconductor substrate by virtue of the trench structure in the weakly doped semiconductor body region, on the top side of the transistors, being completely filled with a dielectric having a high relative permittivity $\in_r$.

Instead of more precise compensation in the case of "CoolMOS", the patent applications DE 10 2004 007 197.7 and DE 10 2004 007 196.9 proposed providing the counter charge via a trench capacitor having a significantly higher capacitance than the surrounding Si. In order to create technically or economically attractive possibilities for use, the relative permittivity of the insulator with which the trench in the Si is filled would have to be approximately $\in_r \approx 1000$. Given typical trench widths and widths of the $n^-$-type region in the region of a few μm, on resistance values that are at least a factor or 3 better than in the case of "CoolMOS" at the present time can be achieved for 600 V components.

However, in order to fill these trench structures with suitable materials having a high relative permittivity, the above documents propose, for filling the trench structures, a material such as Ba$_x$Sr$_y$TiO$_3$, by way of example, which, however, exhibits a strong temperature response with regard to the relative permittivity $\in_r$, its breakdown dielectric strength simultaneously decreasing, so that it is practically impossible to use them in power semiconductor switches in which correspondingly high temperatures are developed as a result of the heat loss. Moreover, materials of this type have hitherto not as yet been introduced or tried and tested in semiconductor technology.

In addition, for the purpose of obtaining a high relative permittivity $\in_r$ of approximately 1000, the above documents propose the use of layered capacitors which alternately have conductive and insulation layers stacked one on top of the other in order to achieve a small overall thickness of the electrically insulating layers in relation to the depth $T_g$ of the trench structure, in order thus to drastically increase the effective relative permittivity. However, the above patent applications fail firstly to disclose suitable materials with which a layered capacitor of this type is to be equipped, and secondly there is no discussion at all of how, in a trench structure a few micrometers wide in a trench several micrometers deep, a layered capacitor can be realized with a tenable outlay in respect of costs.

Furthermore, in the case of trench structures having a width of a few micrometers and a depth of tens of micrometers, there is the problem that harmful shrink holes and/or the inlet slots to the narrow trench close even before the trench structure itself has been filled with corresponding dielectric material.

SUMMARY

It is an object of the invention to provide a capacitor structure in trench structures of semiconductor devices and semiconductor devices comprising trench structures of this type which have, in their entirety, a high capacitance and thus also a high effective relative permittivity of the dielectric. Furthermore, it is an object of the invention to realize predetermined edge potential distributions in a capacitor structure of this type. Finally, it is an objective of the invention to specify a method which makes it possible to achieve a layer sequence exhibiting a few shrink holes and imperfections when filling deep, narrow trench structures of a semiconductor device.

This object is achieved via the subject-matter of the independent claims. Advantageous developments of the invention emerge from the dependent claims.

The invention specifies a capacitor structure in trench structures of semiconductor devices, the capacitor structure having conductive regions made of metallic and/or semiconducting materials, which are surrounded by a dielectric, the conductive regions being arranged as stacked layers in the trench structure of the semiconductor device.

This capacitor structure has the advantage that strongly temperature-dependent dielectrics or insulation materials such as $Ba_xSr_yTiO_3$ are not used for the purpose of obtaining a high effective relative permittivity $\in_{reff}$ in the range of approximately 200 to 1000. Rather, the dielectric used is preferably in the form of metal oxides or semiconductor oxides and/or metal nitrides or semiconductor nitrides corresponding to the materials of the conductive regions, provided that they do not form any volatile oxides or nitrides, and provided that they do not have any conductive nitrides or oxides, such as, for example, highly conductive titanium nitride or conducting indium oxide.

By virtue of the alternating layers of insulator and conductor, it is advantageously possible to increase the effective capacitance in the trench by the factor total thickness/insulator thickness. For $SiO_2$ and a component blocking capability of 600 V, the capacitance for a 50 µm deep trench can be increased from 70 pF/cm² to around 700 pF/cm², because a total $SiO_2$ thickness of 6 µm suffices for the blocking capability, while the capacitor in the trench structure typically has a depth of around 50 µm. For the use of $TiO_2$ as an insulator, the capacitance can advantageously be increased by a factor of 10 to 20 to around 7 to 14 nF/cm², given the same geometry.

In one preferred embodiment of the invention, the conductive regions thus have at least one of the conductive materials silicon, aluminum, titanium, hafnium, tantalum and/or alloys thereof. This limited selection of materials has various advantages. By way of example, the most widespread semiconductor material that is used for semiconductor devices comprising trench structures is silicon and, consequently, a polysilicon as conductive material is better adapted than all other materials, in terms of its thermal expansion behavior, to the semiconductor silicon, which is normally a monocrystalline material. Aluminum in turn has the advantage that not only an aluminum oxide can be formed and used as an insulator, but also the aluminum nitride formed from the aluminum.

From titanium, although only titanium oxide is suitable as an insulation layer, since titanium nitride is a conducting material, titanium dioxide has a relative permittivity $\in_r$ of up to 110, and can be formed by oxidation of a deposited titanium layer, so that it is particularly suitable both technologically and in terms of the physical properties for the construction of a capacitor structure with a trench structure of semiconductors in order to achieve a high capacitance and thus a high effective relative permittivity $\in_{reff}$. The further metal hafnium can be used as a conducting layer, and has the advantage that its oxide can yield the highest relative permittivities for metal oxides; that holds true similarly for tantalum and its oxide $Ta_2O_5$.

In a further preferred embodiment of the invention, the dielectric surrounding the electrically conducting layers thus has one of the following materials: silicon dioxide ($SiO_2$), silicon nitride ($Si_3N_4$), titanium dioxide ($TiO_2$), hafnium dioxide ($HfO_2$), tantalum oxide ($Ta_2O_5$), aluminum oxide ($Al_2O_3$) or aluminum nitride (AlN) or mixtures thereof. From these materials, silicon dioxide has the lowest relative permittivity with approximately $\in_r=4$. All the other oxides and nitrides have a higher relative permittivity, hafnium oxide attaining the highest relative permittivity.

Preferably, the conductive layers of the capacitor structure have electrically conducting titanium nitride and/or hafnium nitride and/or zirconium nitride, and the dielectric surrounding the layers has oxides of titanium, hafnium, and/or of zirconium. This capacitor structure has the advantage that it has materials resistant to high temperatures, and thus enables power semiconductor devices having a correspondingly high thermal loading or having a correspondingly high power loss.

In a further preferred embodiment of the invention, the layers have a single one of the conductive layer materials, the dielectric surrounding the layers being the oxide of this layer material. This has the advantage that, after the application of the conducting material, such as a semiconductor or a metal, this conducting layer can be subjected to an oxidation, thus transforming a region of the conducting material near the surface into an oxide of the conducting material during the in-situ oxidation process. The further advantage consists in the fact that such coatings brought about by oxidation can be produced with a thickness of a few nanometers. Consequently, it is possible to achieve a high effective relative permittivity $\in_r$, especially as the effective relative permittivity comprises the relative permittivity $\in_r$ of the insulator multiplied by a factor of the ratio of the trench depth $T_g$ to the sum of the thicknesses $d_i$ of all the insulation layers in the trench. If the trench thus has a depth of 10 micrometers, then this results, given an $\in_r$ of approximately 4 as is the case for silicon dioxide, for example, in a sum for all the insulator layer thicknesses $\Sigma d_i$ of only 40 nanometers if the intention is to achieve an effective relative permittivity $\in_r$ of 1000, which results in a low breakdown voltage, however. It appears to be more favorable if only an effective relative permittivity of 200 is sought, which results in a thickness of 400 nm for the sum of thicknesses $d_i$ of the dielectric intermediate layers.

On the basis of these considerations, although it would theoretically be possible to achieve, for silicon as well, an effective relative permittivity $\in_{reff}$ of 1000 with only a few electrically conducting layers, the extremely thin insulation layers of a few nanometers would not satisfy the requirement of a high dielectric strength for power semiconductor devices, because extremely thin insulators can easily be tunneled through. However, the combination of a single conductive layer material with a surrounding dielectric having a relative permittivity of the order of magnitude of 8 made of the oxide of this layer material, as in the case of $Al_2O_3$, then appears to be suitable for a higher dielectric strength if the intention is to realize an effective relative permittivity for the capacitor structure in the range of 50-200. In that case, given a trench depth $T_g$ of 10 micrometers, the total thickness of the $Al_2O_3$ oxide layers lies between 400 and 1600 nanometers, which enable a higher dielectric strength.

In one preferred embodiment of the invention, the layer material has polycrystalline silicon, the oxide of which has a relative permittivity $\in_r$ in the region of 4, as mentioned above, so that it is possible to achieve effective relative permittivities $\in_{reff}$ of between 50 and 200 for a layered capacitor in the trench structure, a capacitor structure of this type based on polycrystalline silicon as conductive layer material furthermore having the advantage that filling the trench with layers of polysilicon causes minimal thermo-mechanical stresses in the trench, because the conducting filling material has the same thermal expansion properties as the surrounding semiconductor material. Since charge transport is required only via the thickness of the conductive layers, the polysilicon may additionally remain relatively lightly doped. The minimum conductivity of the electrically conducting layer, and hence the doping, results from the RC time constant of the capacitor stack in the trench structure.

A higher capacitance and thus also a higher effective relative permittivity $\in_{reff}$ can be achieved for structures with layers of a single conductive layer material and the oxide thereof as a dielectric if titanium is used as conductive layer material, especially as titanium dioxide has a relative permittivity $\in_r$ of up to 110. In that case, with a trench depth of 10 micrometers, it is possible to achieve an effective relative permittivity of 1000, it being possible for the total thickness $\Sigma d_i$ of the dielectric layers in the trench structure to have a value of more than 1 micrometer or more than 1000 nanometers. With such thick insulation layers forming a total of more than 1 micrometer, it is possible to achieve a high dielectric strength, on the one hand, and also a high effective relative permittivity (here for example 1000), on the other hand. The ratio of trench depth $T_g$ to the total thickness of the insulation layer can be improved further if the conducting material used is hafnium or tantalum, the oxides of which have even higher relative permittivities $\in_r$ than titanium dioxide.

A further preferred embodiment of the invention uses HfN as conductor and $HfO_2$ as insulator. This combination has a high thermal stability, which does not restrict subsequent process steps very much.

The lower limit for the total thickness of the insulation layers in the layered capacitor is given by the breakdown field strength of the insulator and the total voltage to be blocked across the capacitor structure. In order, by way of example, still to be able to compensate for incorrect potential divisions in the capacitor stack or isolated short circuits between adjacent conductor layers, the total thickness provided for the insulator may also be larger than the minimum required total thickness for ensuring the breakdown field strength of the dielectric or of the insulator. In this case, it must be emphasized that very thin layers having a thickness of less than 10 nanometers by way of example, can be produced without holes, shrink holes or defects only with difficulty, if at all. In this case, it is possible for electrically conducting connections to occur between adjacent conducting layers, the connections causing a potential mismatch in the trench structure which can possibly no longer be afforded tolerance.

From the standpoint of process engineering it is advantageous, therefore, for the thickness both of the conductive layers and of the intervening insulation layers to be made as large as possible, which requires a correspondingly low doping of the $n^-$-type region, however, depending on the relative permittivity $\in_r$ of the insulator material. The limit for the thickness of the conductor layer is influenced by the bending of the equipotential lines at the corners of the conducting layer, especially as, in the case of very thick conductor layers, field spikes may occur in the adjoining semiconductor material of the semiconductor device and may lead to potential mismatches, and may thus lead to a limitation of the blocking capability of the semiconductor device. In the case of only small thicknesses of the conductor layer, the effective relative permittivity that can be achieved is reduced since the thickness portion of the dielectric rises according to the considerations presented above.

It emerges from these considerations that, for a high-voltage-resistant capacitor structure that is simultaneously provided with a high effective relative permittivity $\in_{reff}$ in a semiconductor device trench structure, the highest possible thicknesses $d_m$ and $d_i$ are respectively to be sought both for the conducting layers and for the insulation layers. However, high reverse voltages require a wide space charge zone in the silicon and hence a trench structure having a large trench depth $T_g$.

In a further preferred embodiment of the invention, it is possible to vary the thickness $d_m$ of the conductive layers in the stack in accordance with a predetermined potential distribution (e.g., see FIG. 16). In the event of little bending—brought about by the corners of the conducting layer—of the equipotential lines in the adjoining semiconductor material, then it is possible to reduce the thickness $d_i$ of the insulation layers whilst taking account of the permissible breakdown field strength and, consequently, to increase the effective relative permittivity. In the case of an excessively strong leakage field, it is necessary to reduce the conductor thickness, which leads to an enlarged total thickness $\Sigma d_i$ of the insulation layers owing to the technologically imposed minimum distances between the conductive layers. Consequently, introducing a layered capacitor into a trench structure of a power semiconductor device has the additional advantage that, in principle, any desired potential distribution can be realized by variation of the thicknesses $d_i$ and $d_m$ of the stack structure.

For reasons, e.g., of better adhesion on the conductive layer or as a diffusion barrier, for instance, the insulation layers may, for their part, also be embodied inhomogeneously in layered fashion. Thus, by way of example, the adhesion of an $HfO_2$ layer to conductor materials may be improved via a thin $Al_2O_3$ layer without the relative permittivity of the layer stack decreasing significantly below that of $HfO_2$.

For the construction of a layered capacitor in the trench structure of the semiconductor device, it is advantageous if the walls of the trench retain their originally provided form during the entire construction of the layer structure. Consequently, one preferred embodiment of the invention has trench walls comprising a dielectric coating which have the oxide of the semiconductor material and/or the nitride of the semiconductor material. This applies particularly to the semiconductor material silicon, which forms a non-volatile silicon dioxide or a non-volatile silicon nitride, so that it is advantageous to provide an oxidation and/or nitriding of the trench walls for a silicon semiconductor, it being possible for $Si_3N_4$ to be deposited onto an $SiO_2$ layer by deposition from the vapor phase or by sputtering.

In a further preferred embodiment of the invention, the capacitor structure is embedded in a weakly doped semiconductor body region of one conduction type, which is arranged on a highly doped substrate of the same or opposite conduction type. The capacitor structure surrounds cells of the weakly doped semiconductor body region, the thickness $T_b$ of the weakly doped semiconductor body region being greater than the depth $T_g$ of the trench structure in which the capacitor structure is arranged. A buffer layer having weakly doped semiconductor material of one conduction type is thus produced between the capacitor structure and the highly doped substrate. This embodiment of the capacitor structure has the advantage firstly that the depth $T_g$ of the trench structure in which the capacitor structure is arranged does not have to be adapted exactly to the thickness $T_b$ of the weakly doped semiconductor body region. A buffer layer of this type thus facilitates the fabrication of a capacitor structure or the fabrication of components that are to be equipped with a capacitor structure of this type.

The cells made of weakly doped semiconductor material are preferably arranged in strip-type or grid-type fashion alternately with the capacitor structure one beside the other. This has the advantage that the trench structure can be introduced into the weakly doped semiconductor material relatively simply and inexpensively.

In a further embodiment of the invention, the cells made of weakly doped semiconductor material may be arranged in pillar-type fashion vertically one beside the other in a manner enveloped by the capacitor structure on the highly doped substrate. The corresponding trench structure for the capacitors may be introduced into a semiconductor wafer, for example, with the aid of corresponding maskings via suitable dry etching techniques such as, e.g., plasma sputtering, reactive ion etching, or else in wet-chemical fashion.

A further aspect of the invention relates to semiconductor devices having a capacitor structure of this type. As already explained above, these devices have the advantage that, in the forward-bias range, the forward resistance can be reduced or the conductivity can be increased by virtue of the fact that the weakly doped semiconductor body region may have a doping that is higher by a factor of 3 to 10 compared with present-day compensation components, e.g., the "CoolMOS", and complete blocking of the semiconductor device is nevertheless possible on account the effect of the capacitor structure.

Preferably, a capacitor structure of this type is used to realize a Schottky diode structure. In the case of a Schottky diode structure of this type, the capacitor structure is embedded in a weakly doped semiconductor body region of one conduction type, which is arranged on a highly doped substrate of the same conduction type. In this case, the capacitor structure surrounds a multiplicity of cells of the weakly doped semiconductor body region, and the top sides of the cells have a metal coating of a Schottky contact material. This Schottky contact material forms an individual electrode of a Schottky diode on the weakly doped semiconductor material of a cell. The individual electrodes of the multiplicity of cells are electrically connected in parallel to form an overall electrode and the counterelectrode is formed by the highly doped substrate of the same conduction type as the weakly doped semiconductor body region, the substrate being provided with a metal coating in large-area fashion on its underside, the metal coating serving for electrical contact-connection.

A further preferred semiconductor device constitutes the high-voltage-resistant PN diode structure. In the case of a diode structure of this type, too, cells are formed in the weakly doped semiconductor body region by providing a corresponding trench structure with a capacitor structure. In contrast to the Schottky diode structure, however, a defect well is then introduced in the top side region of each cell comprising weakly doped semiconductor body region of one conduction type, the defect well having an opposite conduction type. This defect well forms the anode of a PN power diode and the highly doped substrate region forms the cathode. For this purpose, the underside of the highly doped substrate has a metallization serving as a counterelectrode or, in the case of a PN diode structure, as a cathode.

A further embodiment of the invention relates to a MOS power transistor structure having a capacitor structure of this type such as is described above. This capacitor structure for the MOS power transistor structure is embedded in a comparatively weakly doped semiconductor body region of one conduction type, which is arranged on a highly doped substrate of the same conduction type. In this case, the capacitor structure surrounds a multiplicity of cells of the weakly doped semiconductor body region and the top side regions of the cells in each case have a MOS structure with individual source electrodes and individual gate electrodes. A medium-doped defect well of an opposite conduction type is arranged in the top side region of the cell in such a way that it is possible to form a gate channel region towards the edge region of the cell in a known manner.

A highly doped defect island of the same conduction type as the weakly doped semiconductor body region of the cell is arranged within the defect well. The defect island has an individual source electrode, and the multiplicity of individual source electrodes of the cells are electrically connected in parallel to form a common source electrode. Moreover, the common source electrode is electrically connected to the capacitor structure. The gate channel region in the edge region of the cell is covered by a gate oxide on which a gate electrode is arranged. The multiplicity of individual gate electrodes of the cells are connected together above the top side of the weakly doped semiconductor body region to form a common gate electrode. The highly doped substrate having the same conduction type as the weakly doped semiconductor body region has, on its underside, a metal coating serving as a large-area drain electrode.

Since, on account of the capacitor structure, a doping of the weakly doped semiconductor body region which is higher by a factor of 3 to 10 compared with the known compensation components is possible without adversely affecting the blocking qualities of the MOS power transistor, this semiconductor device has the advantage that a reduced forward resistance can be realized. A further embodiment of the invention relates to a high-voltage-resistant IGBT power transistor structure. This power transistor is a bipolar transistor with an insulated gate terminal. The structure of this power transistor differs from the structure of a high-voltage-resistant MOS power transistor merely by the fact that the capacitor structure for the high-voltage-resistant IGBT power transistor structure is embedded in a weakly doped semiconductor body region of one conduction type, which is arranged on a doped substrate having an opposite conduction type. This gives rise to a bipolar transistor of the PNP type or of the NPN type, depending on the conduction type and combination of the regions. The substrates of the above-described components (Schottky diode, PN diode, MOSFET, IGBT) may also comprise just a thin contact or emitter region.

A method for fabricating a layered capacitor for semiconductor devices comprising trench structures has the following method steps. Firstly, the trench walls are afforded protection by effecting isotropic oxidation and/or nitriding of the interfaces such as trench walls and/or trench bottom of the trench structure as wall protection. Completion of the wall protection is then followed by a first anisotropic deposition of an oxidizable and/or nitridable conductive material in the trench structure, the deposition rate at the walls being significantly lower, on account of the anisotropy, than at the bottom of the trench structure. The next step effects complete oxidation and/or nitriding of the conductive layer deposited on the walls of the trench structures, with simultaneous oxidation and/or nitriding of the surface region of the conductive layer deposited at the bottom of the trench structure, to form a dielectric inter mediate layer. A first layer sequence comprising the conductive layer and the dielectric intermediate layer has thus been produced at the bottom of the trench structure.

By repeating the method steps of anisotropic deposition of a conductive material and subsequent complete oxidation and/or nitriding of the material on the walls of the trench structure, it is thus possible to construct a layered capacitor until the entire trench structure is filled with this layer sequence.

This method has the advantage that, as a result of the simple alternation of anisotropic deposition of a conductive layer and subsequent oxidation or nitriding of these conductive layers at the bottom of the trench structure, a layer sequence grows, comprising thin insulating intermediate layers and correspondingly applied conductive layers, while the walls of the trench structure no longer have a conductive layer. If the coating of the walls becomes too thick despite anisotropic deposition in the course of forming layer sequences, then it is possible, via a step of isotropically etching back the insulation layers formed on the trench walls, to ensure that the width of the conducting layers at the bottom of the trench structure does not fall below a predetermined minimum amount.

As an alternative to the layer sequence of metal and insulating metal oxide or nitride, it is also possible, for higher thermal loading, for example, to alternate between the conductive metal nitride and the insulating metal oxide (e.g. in the case of Ti, Zr, Hf).

A method for fabricating a layered capacitor for semiconductor devices comprising trench structures has the following method steps. Isotropic oxidation and/or nitriding of the walls of the trench structure as wall protection is carried out first of all. This is followed by anisotropic deposition of a conductive material in the trench structure, the deposition rate at the walls being lower at least by a factor of 2 than at the bottom of the trench structure. The conductive material is subsequently etched back isotropically until the walls are free of a conductive coating. This is followed by anisotropic deposition of an insulating material in the trench structure, the deposition rate at the walls being lower at least by a factor of 2 than at the bottom of the trench structure. Finally, the last three steps above are repeated until the trench structure is filled with a layered capacitor structure.

This method has the advantage that it is not necessary to effect patterning and selective masking within the trench structure for introduction of a layered capacitor structure into the trench structure, with the result that costly and time-consuming intermediate steps are obviated.

For material combinations which do not enable complete oxidation and/or nitriding of the conductive layers deposited on the walls of the trench structure, an alternative method for fabricating a layered capacitor for semiconductor devices comprising trench structures is specified, which has the following method steps.

Firstly, as in the method above, a wall protection is produced by isotropic oxidation and/or nitriding of the walls of the trench structure. Afterward, as in the method above, anisotropic deposition of a conductive material in the trench structure is carried out, the deposition rate at the walls being lower at least by a factor of 2 than at the bottom of the trench structure. Instead of a dielectric material being grown, a dielectric material is then deposited anisotropically in the trench structure on the conductive material. What is achieved in this case by virtue of the anisotropy is that the deposition rate at the walls is at least significantly lower than the deposition rate of the insulating material on the bottom of the trench structure.

The next step effects unpatterned application of a protective layer that completely fills the trenches. The protective layer is subsequently etched back into the trenches, so that the dielectric material is covered at the bottom of the trench structure, while the walls of the trench structure have already been stripped of the protective layer. The subsequent step then involves etching back the layer sequence deposited on the walls as far as the wall protection. In this case, the protective layer may comprise a protection, typically a photoresist, or some other material, preferably comprising the next conducting layer.

Afterward, the protective layer may be removed, and the deposition and etching-back steps are repeated until the trench structure is completely filled. The masked etching-back described above may also be effected after a plurality of deposition cycles if, on account of the anisotropic deposition of the conductive material or insulating material, the reduction of the width of the layers to be deposited, at the bottom of the trench structure, is only small per deposition layer, so that the etching-back is to be carried out only after a multiple anisotropic deposition process.

The etching-back may give rise to undercuts of the capacitor structure already formed along the trench walls, so that these undercuts have to be filled by an additional step of depositing dielectric material.

In the course of the deposition of the various layers, the deposition parameters during the anisotropic application of conductive and/or dielectric material, for the purpose of setting different layer thicknesses, may be varied in accordance with a predetermined required potential profile in the stacking direction of the layered capacitor. This control of the layer thicknesses via deposition parameters can be monitored very precisely through corresponding in-situ thickness measuring methods during the deposition which directly detect the increase in the layer thicknesses and terminate the process when the required layer thickness is attained.

In a further preferred implementation of the method, an etching-back step is interposed when overhangs of deposited material are formed at the entrance to the trench structure, the layer stack already formed being protected via the method described above. This etching-back step for eliminating overhangs at the trench entrance is necessary for both method variants in order to fill the entrance of the trench structure until the trench depth $T_g$ has been completely filled with the predetermined layer sequence.

In order to carry out isotropic oxidation of the walls of the trench structure, an oxidation in an oxygen and/or water vapor atmosphere or an oxygen-containing plasma is carried out. Such oxidations in an oxygen and/or water vapor atmosphere do not have a preferred direction, so that it is possible to form an oxide having a constant thickness.

An, optionally plasma-enhanced, chemical vapor deposition is preferably used for isotropic nitriding of the walls of the trench structure. With this form of deposition, the nitriding is effected without a preferred direction, so that a uniform protection of the walls and of the bottom of the trench structure may arise.

For a complete oxidation of the conductive layer deposited on the walls of the trench structure, an isotropic oxidation in an oxygen and/or water vapor atmosphere or an oxygen-containing plasma is carried out. Since the thicknesses of the conductive layer at the bottom of the trench structure and at the wall of the trench structure differ significantly on account of the anisotropic deposition of the conducting layer, it is possible to completely oxidize the relatively thin conductive layer at the walls of the trench structure. Consequently, as long as the walls now coated with insulation material do not significantly reduce the width of the trench structure, a direct sequence of anisotropic deposition and isotropic oxidation may ensure that a layer sequence of conductive layers and insulating layers is constructed on the bottom of the trench structure.

For an anisotropic deposition of a conductive and/or insulating material, it is possible to use a sputtering method in which a material source is sputtered and is accelerated in directional fashion onto the top side of the semiconductor device.

For an anisotropic deposition of a conductive material, a physical vapor deposition in vacuo is also possible, in the case of which the conductive material is melted and, proceeding from the melt source, impinges rectilinearly on a surface of a semiconductor device, so that the walls of the trench structure are coated to a lesser extent than the bottom of the trench structure.

In a further preferred method, use is made of a directional ion beam deposition from a plasma. For this purpose, a plasma of conductive ions is generated and accelerated via an electric field in the direction of the surface of the semiconductor device in such a way that the ions of a conductive material penetrate the trench structure orthogonally with respect to the surface of the semiconductor material and preferably deposit at the bottom of the trench structure.

In preparation for the etching-back, the layer structure already formed on the bottom of the trench is protected via a protective layer. However, this protective layer ought not to cover the walls of the trench structure, in order to ensure that the etching-back can be performed. One possibility for removing this protective layer after the etching-back has been effected consists in subjecting the semiconductor device or a semiconductor wafer having the devices to a plasma incineration, so that the deposition of corresponding layer sequences for a layered capacitor can be continued.

To summarize, it is to be emphasized that the capacitor in a trench structure of a semiconductor device that is fabricated by this method is distinguished by the fact that a high capacitance and also a high effective relative permittivity $\in_{reff}$ of the dielectric can be achieved. Moreover, through a corresponding choice of the process parameters, it is possible to achieve a targeted potential distribution in the capacitor, which, if necessary, deviates from a linear potential distribution. This results in greater freedom in the choice of the doping in the adjoining $n^-$-type regions of the semiconductor device. This can be designed in inhomogeneous fashion in the vertical direction in order to modify component properties, such as the avalanche behavior for example, in a targeted manner. Moreover, the potential distribution in the trench can be produced independently of the trench form through targeted variation of the thicknesses of the deposited layers. Thus, in the case of trench structures that are bulgy or extended upwards or downwards, the associated non-linear potential profiles can additionally be influenced by variation of the layer thicknesses.

For this purpose, the method according to the invention is based on alternately producing electrically conducting and insulating layers. In this case, the conducting layers are preferably produced non-conformally, in other words non-isotropically, by virtue of the layers being deposited via a sputtering method or a vapor deposition method. This gives rise to a thicker conductive layer at the bottom of the trench in comparison with the trench walls. Isotropic deposition of the conductor material is likewise possible, but it then becomes necessary more frequently to interpose an etching-back step in order to free the walls of these layers.

If the conductive material comprises an oxidizable metal such as aluminum, titanium or polycrystalline silicon, then it is possible to produce the insulating separating layer between two adjacent metal layers through targeted and only superficial oxidation of the conducting material. In the case of the deposition, during the deposition of the conductor layer it is possible, at defined times, to add the reactant for producing the insulator into the deposition chamber in a targeted manner in order to produce the layer sequence without interrupting the deposition process.

If, as an alternative, use is also made of aluminum nitride or some other insulating compound of the conductor material, the conducting material can be converted into an insulating layer at the surface via a corresponding chemical reaction in this case as well. A particular advantage of such methods for in-situ fabrication of a layer sequence is that no additional defects arise in the insulation layer. This is a crucial advantage over deposition of the insulation layers, in which the risk of defects arising is significantly higher. Therefore, such insulation layers produced by a reaction can be made extremely thin, especially as the required safety surplus on the thickness for the purpose of achieving the required blocking capability may turn out to be smaller.

As an alternative, however, the insulation layer may also be deposited directly onto the conductor material without any chemical reaction, but it is necessary to increase the safety surplus on the thickness in order to achieve the blocking capability. In this case, after each deposition of a layer pair comprising a conductor and an insulator, a protective layer is produced selectively in the trench in order that only the wall of the trench is etched free. Given sufficiently anisotropic deposition, that is to say sufficiently little deposition on the walls, it is also possible to dispense with the etching-back step, or it may be carried out as an unmasked isotropic etching step.

BRIEF DESCRIPTION OF THE DRAWINGS

The invention will now be explained in more detail with reference to the accompanying Figures.

FIGS. 2 to 5 show schematic diagrams of method products after individual method steps for fabricating a capacitor structure;

FIG. 2 shows a schematic diagram of a trench structure after the anisotropic deposition of a conducting layer;

FIG. 3 shows a schematic diagram of a trench structure, in accordance with FIG. 2, after a complete oxidation of a wall coating of the conducting coating deposited in FIG. 2;

FIG. 4 shows a schematic diagram of a trench structure, in accordance with FIG. 3, after renewed anisotropic deposition of a conducting layer;

FIG. 5 shows a schematic diagram of a trench structure, in accordance with FIG. 4, after renewed oxidation of the conductive material of the anisotropically deposited conducting coating;

FIGS. 6 to 9 show schematic diagrams of method products after individual method steps for fabricating a capacitor structure, in accordance with an alternative method procedure;

FIG. 6 shows a schematic diagram of a trench structure after the anisotropic deposition of a conducting layer;

FIG. 7 shows a schematic diagram of the trench structure, in accordance with FIG. 6, after selective application of a protective layer to the bottom of the trench structure;

FIG. 8 shows a schematic diagram of the trench structure, in accordance with FIG. 7, after the coated walls of the trench structure have been etched back;

FIG. 9 shows a schematic diagram of the trench structure, in accordance with FIG. 8, after the removal of the protective layer and after the application of a further insulation layer;

DETAILED DESCRIPTION

Figure 1A:
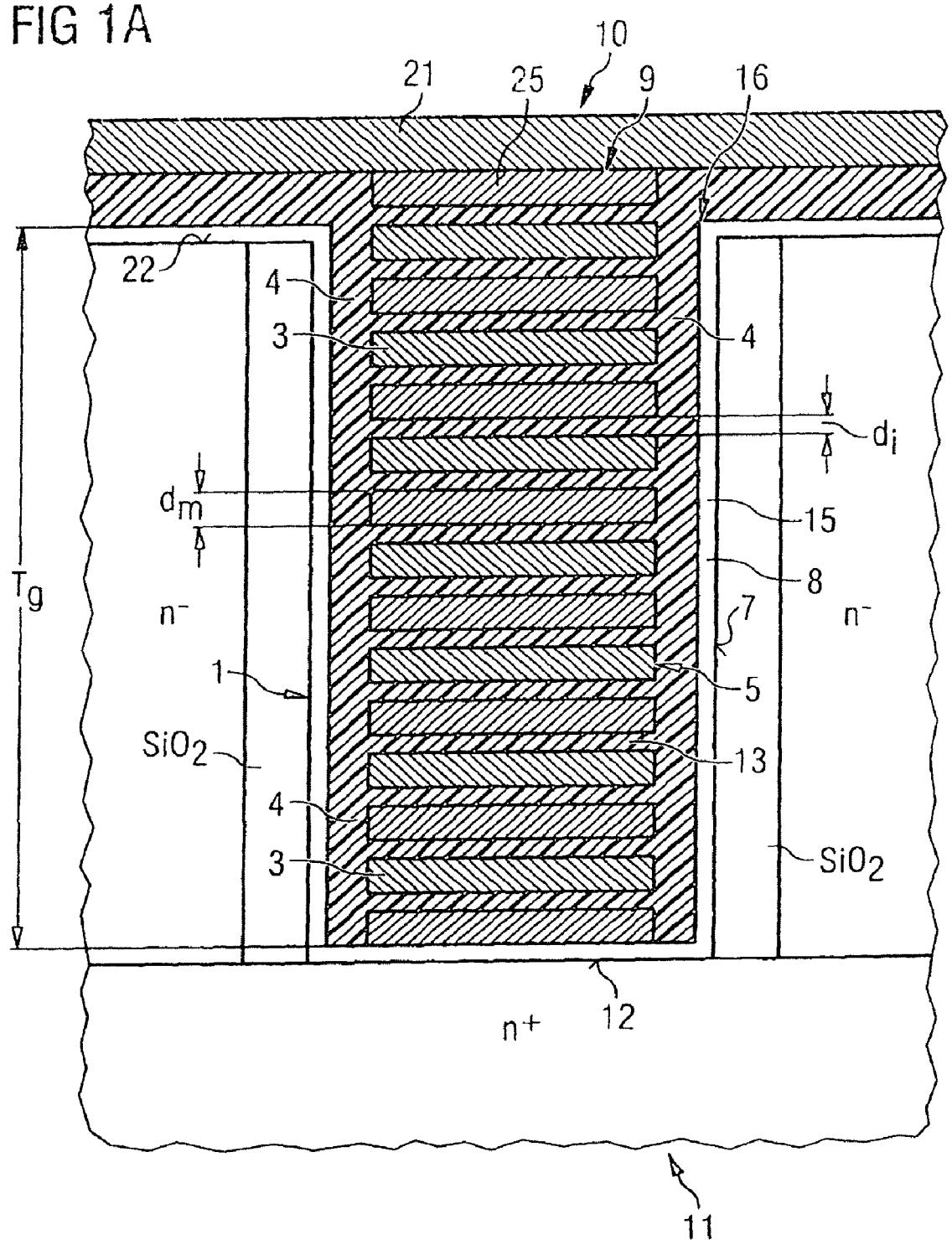
FIG. 1A shows a schematic cross section through a capacitor structure of a semiconductor device with trench structure, of a first embodiment of the invention.

FIG. 1A shows a schematic cross section through a capacitor structure 10 of a semiconductor device 11 with trench structure 1, of a first embodiment of the invention. The capacitor structure 10 is arranged between an electrode 21 on the top side 22 of a semiconductor device 11 and a highly doped n$^+$-conducting region of a counterelectrode of the semiconductor device. In this case, the electrode 21 on the top side 22 of the semiconductor device may be an anode of a PN or Schottky power diode or a source electrode of a vertically arranged power MOS transistor or IGBT. The cathode region of a power diode or the drain zone of a power MOS transistor may be connected to the n$^+$ conducting region.

The layered capacitor 9 between these two terminal regions is accommodated in a trench structure 1, where it has conducting layers 3 alternating with insulating layers 4 which are stacked one above the other. In this case, each conducting region 3 is completely surrounded by the dielectric of the insulating layers 4. Only the topmost conducting layer 25 can be connected to the corresponding electrode 21 of a source region or of an anode region or be formed by the electrode. This layered capacitor 9 makes it possible to increase the capacitance of the capacitor structure 1 since the plate spacing between the electrodes of the capacitor is reduced by the conducting layers 3 to the total thickness $\Sigma d_i$ of the insulating layers 4. For a layered capacitor 9 of this type, this results in an effective relative permittivity of $$\in_{reff} = \in_r \cdot T_g / \Sigma d_i \quad [1]$$

where $\in_{reff}$ is the effective relative permittivity, $\in_r$ denotes the relative permittivity of the insulator material, $T_g$ represents the depth of the trench structure, and a $d_i$ defines the thickness of an individual insulating layer. The trench depth $T_g$ results from the sum of the thicknesses $\Sigma d_m$ of the conducting layers 3 and the sum of the thicknesses $\Sigma d_i$ of the insulating layers 4, so that the required blocking capability is achieved with the aid of the filled trench depth $T_g$. In the structure shown in FIG. 1, the walls 7 of the trench structure 1 are isolated from the semiconductor region n$^-$ and n$^+$, respectively, by an insulating coating 8 of the trench walls 7 and of the trench bottom 12. Furthermore, the walls 7 of the trench structure 1 are surrounded by an insulation layer, for example made of silicon dioxide SiO$_2$, which is adjoined by an n$^-$-conducting region of the semiconductor structure. Instead of or in addition to the insulation layer SiO$_2$ surrounding the trench walls 7, a compensation layer made of p$^-$-conducting semiconductor material may also surround the trench structure 1 at its trench walls 7. However, the compensation layer may also be produced in the n$^-$-type region behind or below the insulating coating 8. The lateral insulation of the conducting layers 3 with respect to the n$^-$-type region may also be formed just by an insulation layer surrounding the trench walls 7. In this case, the material of the insulating layers 4 is situated only between the conducting layers 3.

With its stacked layers 5, the layered capacitor 9 completely fills the trench structure 1 of the semiconductor device 11, and extends from the n$^+$-conducting region of a cathode or a drain zone as far as the metal electrode or silicon electrode 21, a cathode or a source region of a diode or a transistor. The coating 8 of the trench walls 7 forms a wall protection 15 for the fabrication of such structures. The intermediate layer 13 shown in this FIG. 1 is made of the same material as the dielectric 4 surrounding the conducting layers 3, and has preferably been fabricated by oxidation or nitriding of the material of the conducting layers 3.

Using the formula $\Sigma d_i$ above as a basis, with this structure it is possible to achieve effective relative permittivities $\in_{reff}$ of 1000 or more, if the relative permittivity $\in_r$ of the dielectric 4 is in the region of 100 or more, as is the case for the materials tantalum oxide, titanium oxide and hafnium oxide. For materials having a low relative permittivity of between 3 and 10, as is the case for silicon dioxide or aluminum oxide, it is possible to achieve technically effectively relative permittivities of between 50 and 200 with such a capacitor structure 20 as shown in FIG. 1. One advantage of this layered construction of the dielectric in the form of a capacitor is that the thickness $d_m$ and also the thickness $d_i$ of the stacked layer 5 can be varied and, consequently, it is possible to set the potential profile in the vertical direction upon application of a reverse voltage in a manner deviating from a linear profile, as occurs with a non-patterned dielectric in a trench structure of this type. It is thus possible to adapt the potential profile in the vertical direction of the capacitor 10, via its structure, to the requirements of the respective semiconductor device 11.

Figure 1B:
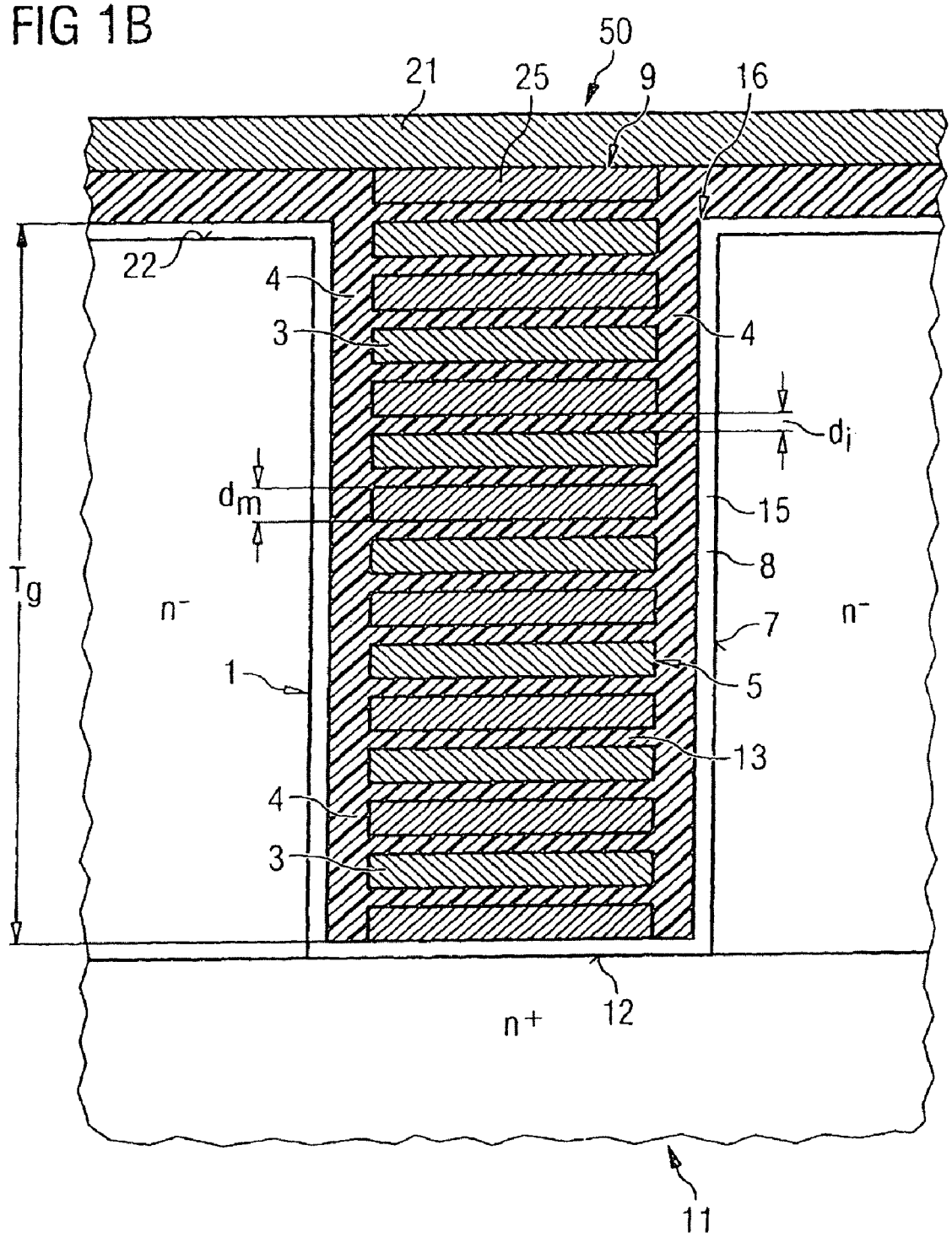
FIG. 1B shows a schematic cross section through a capacitor structure of a semiconductor device with trench structure, of a second embodiment of the invention.

FIG. 1B shows a schematic cross section through a capacitor structure 50 of a semiconductor device with trench structure, a second embodiment of the invention. Components having functions identical to those in FIG. 1A are identified by the same reference symbols and are not discussed separately. This embodiment differs from the first embodiment in accordance with FIG. 1A by virtue of the fact that the additional wall protection 15 made of SiO$_2$, which is intended to additionally increase the dielectric strength, is no longer provided.

Figure 1C:
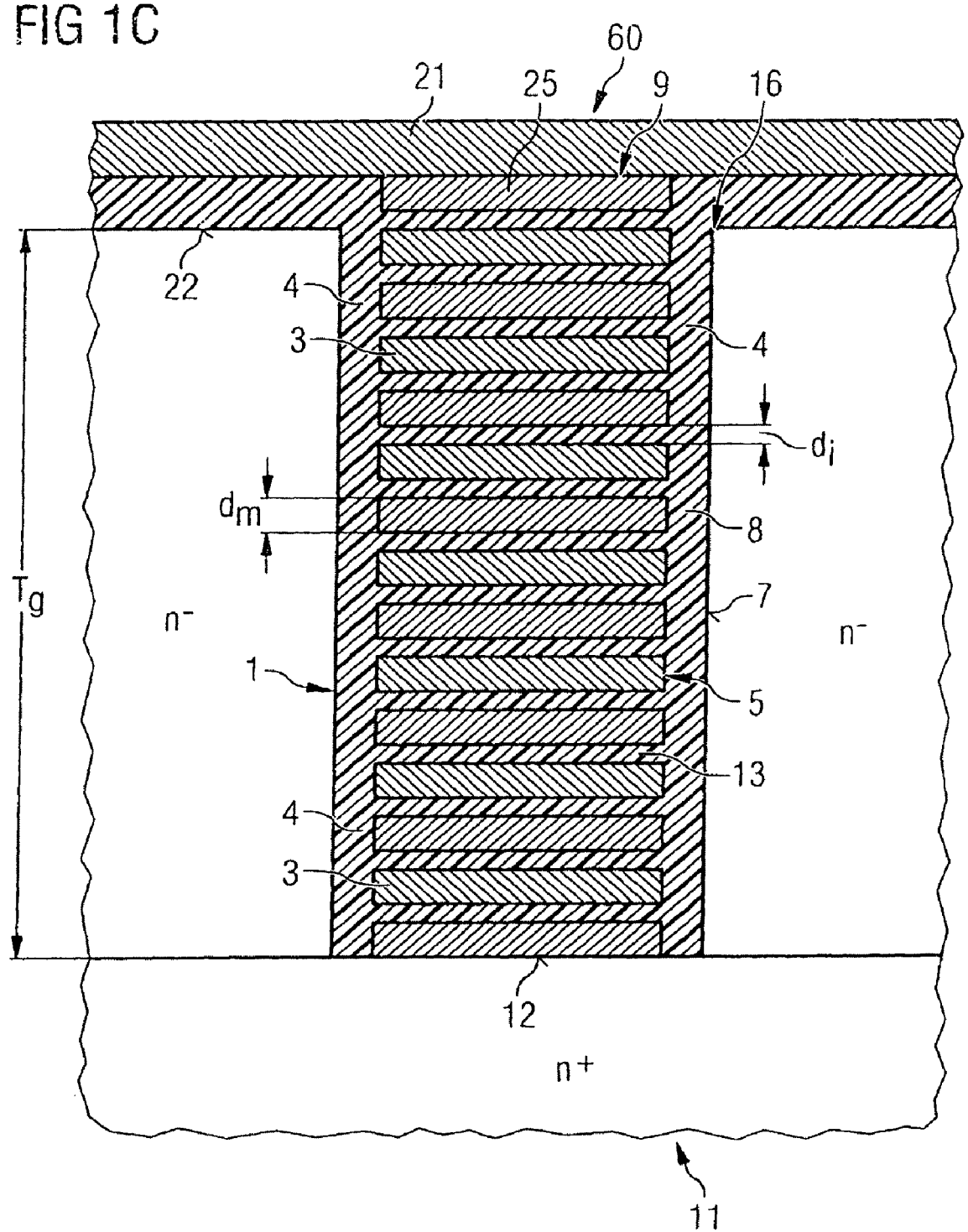
FIG. 1C shows a schematic cross section through a capacitor structure of a semiconductor device with trench structure, of a third embodiment of the invention.

FIG. 1C shows a schematic cross section through a capacitor structure 60 of a semiconductor device with trench structure, of a third embodiment of the invention. Components having functions identical to those in FIG. 1A are identified by the same reference symbols and are not discussed separately. This embodiment differs from the second embodiment in accordance with FIG. 1B by virtue of the fact that a coating 8 of the trench walls has been dispensed with and this function is concomitantly undertaken by the insulation layer 4. Furthermore, the lower conducting layer of the layered capacitor is now connected to the highly doped substrate material and is at the same electrical potential.

FIGS. 2 to 5 show schematic diagrams of method products after individual method steps for fabricating a capacitor structure 10. Components having functions identical to those in FIG. 1 are identified by the same reference symbols in FIGS. 2-5 and are not discussed separately.

FIG. 2 shows a schematic diagram of a trench structure 1 after the anisotropic deposition of a conducting layer 18. As a result of the anisotropy of the deposition, regions that lie orthogonally with respect to the material flow of the deposition become thicker than regions that are arranged parallel to the deposition direction. Consequently, it is possible for the thickness $d_{ma}$ of a deposited conducting layer 18 on the trench walls 7 of a trench structure 1 to become considerably thinner than the coating deposited on the top side 22 of the semiconductor device 11 and in the bottom region 12 of the trench 1. However, before the trench structure 1 is provided with such a conducting layer 18 made of polysilicon, aluminum, titanium, hafnium, tantalum or alloys or chemical compounds thereof, the wall and also the bottom 12 of the trench structure 1 are provided with a wall protection 15 formed, in the case of a silicon semiconductor device 11, by way of example, by isotropic oxidation and/or nitriding of the surfaces of the trench structure 1. This wall protection 15 ensures that the contour of the trench 1 is preserved during subsequent method steps. The wall protection 15 may also be completely or partially removed at the trench bottom in order to produce an electrical connection between the bottommost conductor layer 18 and the n$^+$-type substrate, as is shown in the third embodiment of the invention with the aid of FIG. 1C.

FIG. 3 shows a schematic diagram of a trench structure 1 in accordance with FIG. 2 after complete oxidation of a wall coating 6, of the conductive layer 18 deposited in FIG. 2. A thin wall insulation layer 23 forms in the course of this complete oxidation, the width of the trench structure being slightly reduced in the case of the wall insulation layer. At the same time, an insulating intermediate layer 13 forms on the coating 18 at the bottom 12 of the trench structures, the thickness $d_i$ of which intermediate layer can be controlled depending on the duration of the oxidation phase, so that the initial thickness $d_{ma}$ of the layer 18 in FIG. 2 is now reduced to the thickness $d_{m1}$ at the bottom of the trench structure. Forming the oxidation layer 13 by oxidation of the conductive layer has the advantage over an anisotropic deposition of an insulation layer that the entire surface forms a dense oxide free of shrink holes, and that this dielectric layer is almost perfect, and accordingly insulates high electric field strengths.

FIG. 4 shows a schematic diagram of a trench structure 1 in accordance with FIG. 3 after renewed anisotropic deposition of a conducting layer 19. The latter is fabricated, e.g., via the same technology as the first conducting layer 18, but the material of the conducting layer 19 may be changed in order to produce an oxide having a higher relative permittivity $\in_r$ in the subsequent oxidation process. By varying the different conducting layer materials, it is also possible to achieve a variation of the relative permittivities for the intermediate layers 13, dielectrics of the insulating materials silicon dioxide, silicon nitride, titanium dioxide, hafnium dioxide, tantalum oxide or aluminum oxide, or aluminum nitride preferably being provided. The thin electrically conducting layer in the wall region of the trench structure 1 is then again subjected to an oxidation or nitriding process.

FIG. 5 shows a schematic diagram of a trench structure 1, in accordance with FIG. 4, after renewed oxidation of the conductive material of the anisotropically deposited coating 19. A thin insulation layer 24 again arises in the wall region of the trench structure 1, while the thickness $d_{i2}$ of the insulating intermediate layer 13 in the bottom region 12 of the trench structure 1 can be set via the corresponding process parameters. Conducting material is consumed during this oxidation, so that the conductive layer formed at the bottom has a smaller thickness $d_{m2}$ than the originally deposited layer 19 shown in FIG. 4.

The layered capacitor formed at the bottom 12 of the trench structure 1 now has two conducting layer regions 4 and two insulating intermediate layers 13. These steps as shown in FIGS. 2, 3, 4 and 5 can then be repeated until the entire trench structure is filled. However, the trench structure 1 also grows over slowly from the trench walls 7, as a result of the formation of the insulation layers 23 and 24, etc., so that the width of the trench 1 decreases in the direction towards the top side 22 of the semiconductor device 11. If, as a result, the opening 16 of the trench structure grows over due to the formation of an overhang or the cross-sectional area of the conductor layer is reduced to an excessively great extent and the capacitance is thereby reduced, it is necessary to interpose an etching-back step during these processes, in order that, on the one hand, the top side 22 of the semiconductor device 11 is freed of the layers 18 and 19 and, on the other hand, the walls 7 of the trench structure 1 are etched free again. In this case, the etching methods are coordinated with the different materials used, so that an etching stop can act in the region of the wall coating 8 of the trench structure 1.

FIGS. 6 to 9 show schematic diagrams of method products after individual method steps for fabricating a capacitor structure 10, in accordance with an alternative method procedure. Components having functions identical to those in previous figures are identified by the same reference symbols in FIGS. 6 to 9 and are not discussed separately.

FIG. 6 shows a schematic diagram of a trench structure 1 after an anisotropic deposition of a conducting layer 18. However, this deposition has given rise to a conducting wall layer 6 that is either too thick to be converted into an insulation layer throughout. In this case, the conducting layer deposited on the bottom 12 of the trench structure 1 is protected by a protective layer 14 before the rest of the conducting structure is etched away or etched back.

FIG. 7 shows a schematic diagram of the trench structure 1 in accordance with FIG. 6 after a protective layer 14 has been produced selectively on the bottom 12 of the trench structure 1. With this protective layer 14, which is arranged only in the trench structure 1 of the semiconductor device 11, and also does not cover the side walls 7 of the trench structure 1, it is possible for the wall region of the trench structure 1 to be freed of the deposited conducting layer 18.

FIG. 8 shows a schematic diagram of the trench structure 1, in accordance with FIG. 7, after the coated walls 7 of the trench structure 1 have been etched back. As shown in this Fig., the etching of the wall protection 15, which was originally applied to the trench structure by nitriding or oxidation, for example, stops. However, undercuts 17 of the conducting layer possibly form. These undercuts 17 are filled with insulation material during the subsequent step 4.

FIG. 9 shows a schematic diagram of the trench structure 1, in accordance with FIG. 8, after the removal of the protective layer 14 and after the application of an insulation layer 4. This insulation layer 4 at the same time concomitantly fills the undercut 17 and, as shown in FIG. 9, may be formed for example via an isotropic deposition, so that the layer thickness $d_i$ on the side walls 7 is the same as in the bottom region 12 of the trench structure 1. In such a case, for the insulation layer 13 as well, it is necessary for the walls 7 to be etched free, since otherwise the width of the trench structure 1 grows over too rapidly and does not suffice for achieving complete stacking of the layers 3 and 4, or the capacitance of the stacked capacitor decreases to an excessively great extent.

Figure 10:
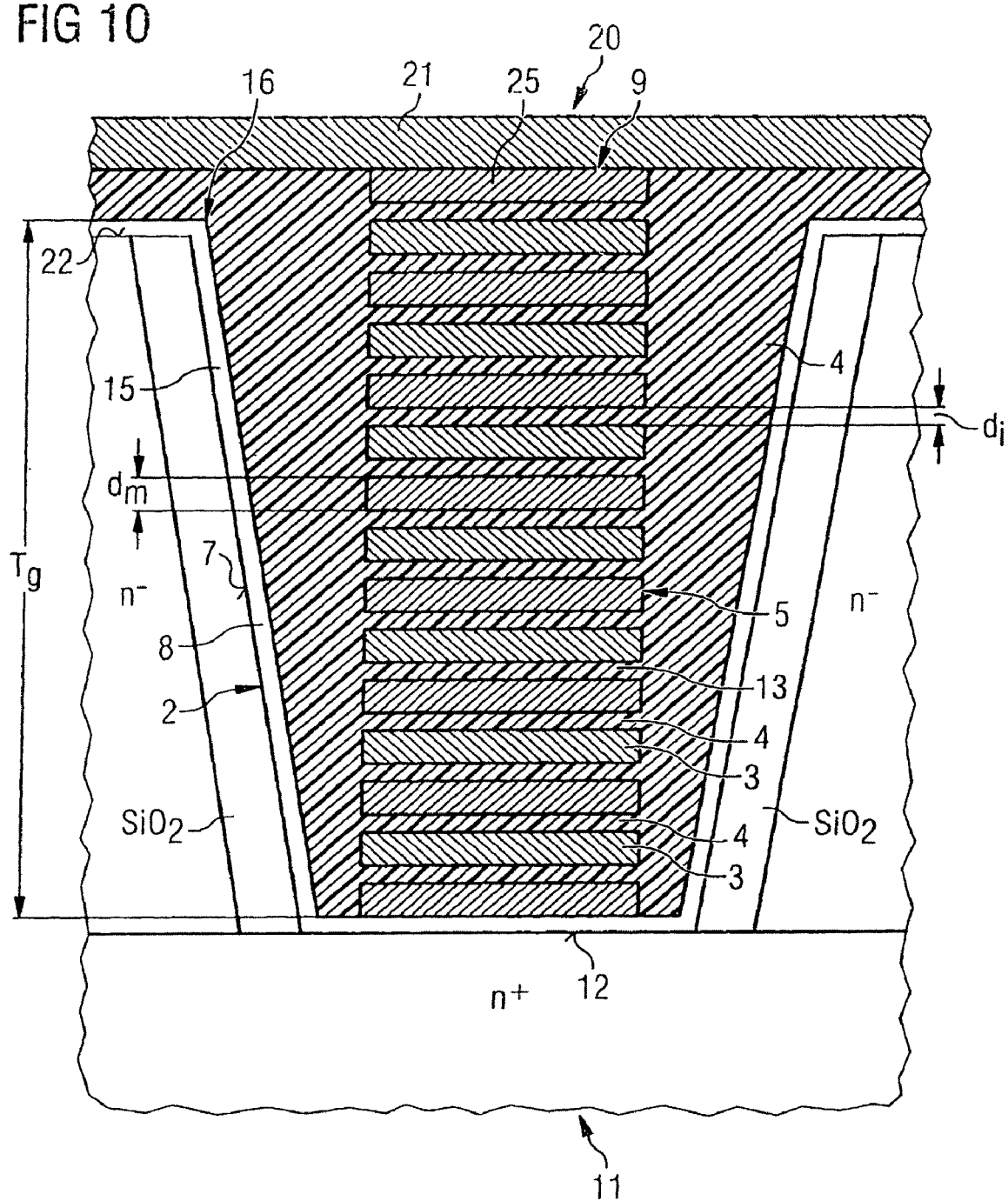
FIG. 10 shows a schematic cross section through a capacitor structure of a semiconductor device with trench structure, of a fourth embodiment of the invention.

FIG. 10 shows a schematic cross section through a capacitor structure 20 of a semiconductor device 11 with trench structure 2 of a fourth embodiment of the invention. Components having functions identical to those in the previous figures are identified by the same reference symbols and are not discussed separately. The difference with respect to the trench structure of FIG. 1 is that the trench opens and widens trapezoidally towards the entrance 16 of the trench structure 1. This has the advantage that during the deposition of the various insulation layers 4 and metal layers 3, during the fabrication process, it is possible to avoid etching free the walls 7 to the greatest possible extent, since, by virtue of the increasing width of the trench structure 2, the insulation layers that form on the walls 7 can be retained without etching-back, and without reducing the size of the conducting region 3 in the vertical direction.

Figure 11:
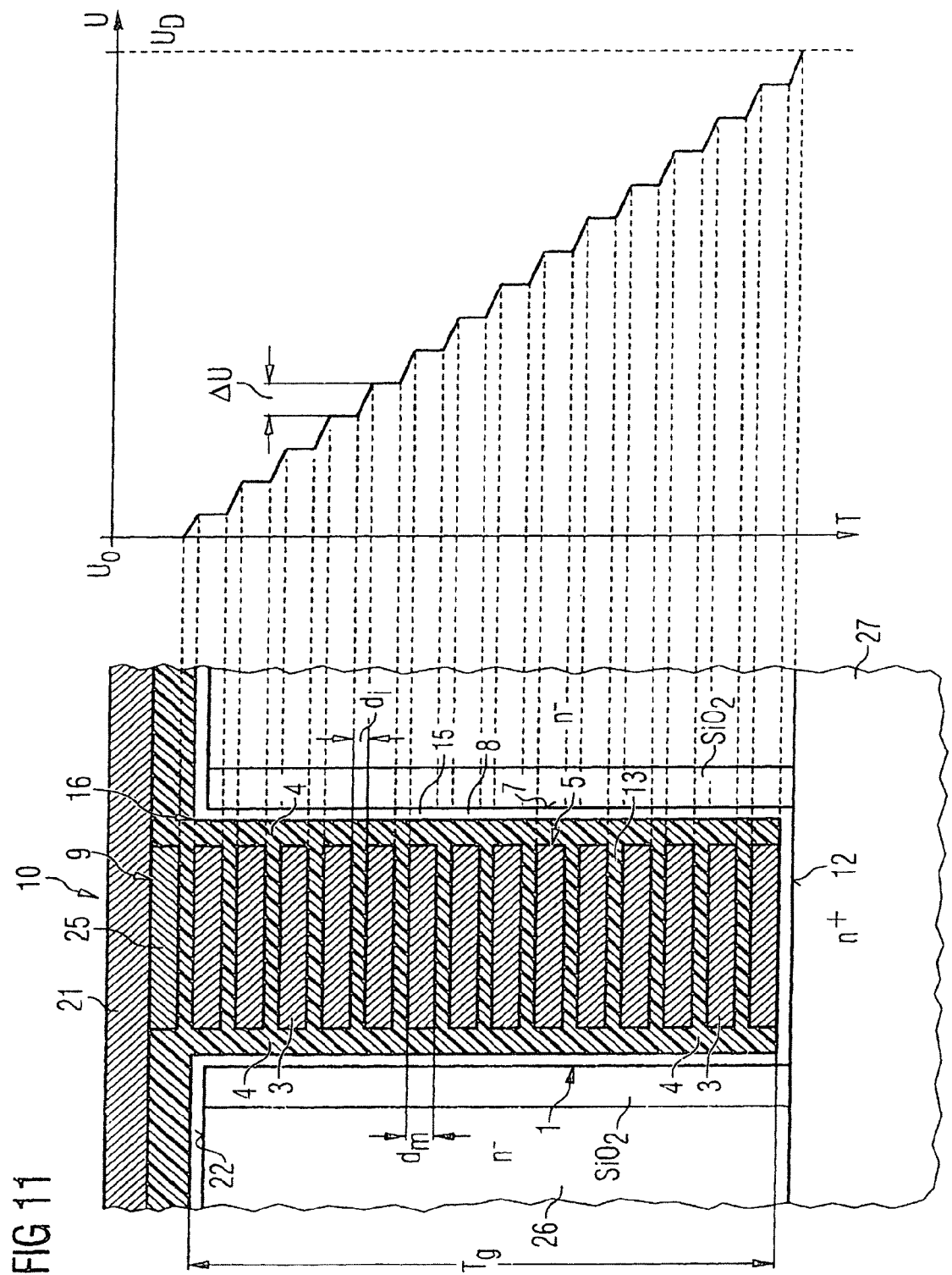
FIG. 11 schematically shows the potential profile for a capacitor structure in accordance with one embodiment of the invention.

FIG. 11 schematically shows the potential profile for a capacitor structure 10 in accordance with a first embodiment of the invention. For this purpose, a cross-section through a capacitor structure 10 of a semiconductor device with trench structure 1 is depicted on the left-hand side of FIG. 11, the capacitor structure 10 being arranged between an electrode 21 on the top side 22 of the semiconductor device and a highly doped $n^+$-conducting region of a counterelectrode of the semiconductor device. The electrode 21 on the top side 22 of the semiconductor device may be an anode of a power diode or a source electrode of a vertically arranged MOS power transistor.

The cathode region of a power diode of or the drain zone of a MOS power transistor may be connected to the $n^+$-conducting region. Accordingly, the potential is spread proceeding from the electrode 21 to the $n^+$-conducting region from a voltage $U_0$ of the electrode 21 to a voltage $U_D$ of the counterelectrode. While the voltage remains constant over the thickness $d_m$ of each conducting region 3 of the layered capacitor, the voltage difference $U_D-U_0$ is spread over the insulating layers 4 with their thicknesses $d_i$. The dielectric strength of each insulating layer is thereby reduced to a fraction of the total voltage difference $U_D-U_0$ between the electrode 21 and the counterelectrode, to a fraction $\Delta U$. As a dimensioning rule, a dielectric strength of 100 V/μm holds true for conventional dielectrics, e.g., for $SiO_2$.

A reverse dielectric strength of 10 V/μm to 20 V/μm holds true for the adjoining $n^-$-type silicon, so that, with a drift zone of 50 μm, a reverse voltage of 600 V can be applied between the electrode 21 and the counterelectrode. A capacitance $C_D$ for conventional dielectrics of this type such as $SiO_2$ with an $\in_r \approx 4$ attains a magnitude of $C_D \approx 3.5$ nF/cm$^2$ for 100 V or $C_D \approx 600$ pF/cm$^2$ for 600 V.

If dielectrics such as $TiO_2$ are used, then a relative permittivity that is higher by a factor of 10 to 20, $\in_r \approx 40$ to 80, may be reckoned with and a capacitance that is higher by a factor of 10 to 20 may be expected for such a layered capacitor 9 having the same geometry as a layered capacitor 9 with an $SiO_2$ dielectric. The potential profile emerging from this capacitor structure 10 may be altered on the one hand by using different materials for the individual insulation layers 4, and on the other hand by varying the distance between the conducting regions 3 and, in contrast to this example, not providing a uniform thickness $d_i$ for the insulation layers 4 (see, e.g., FIG. 16). It is thus possible to set an arbitrary non-linear profile for the potential between $U_0$ and $U_D$. FIGS. 12 to 15 show various semiconductor devices 11 with a capacitor structure 10 of this type such as is described above. Components having functions identical to those in the previous figures are identified by identical reference symbols and are not discussed separately.

Figure 12:
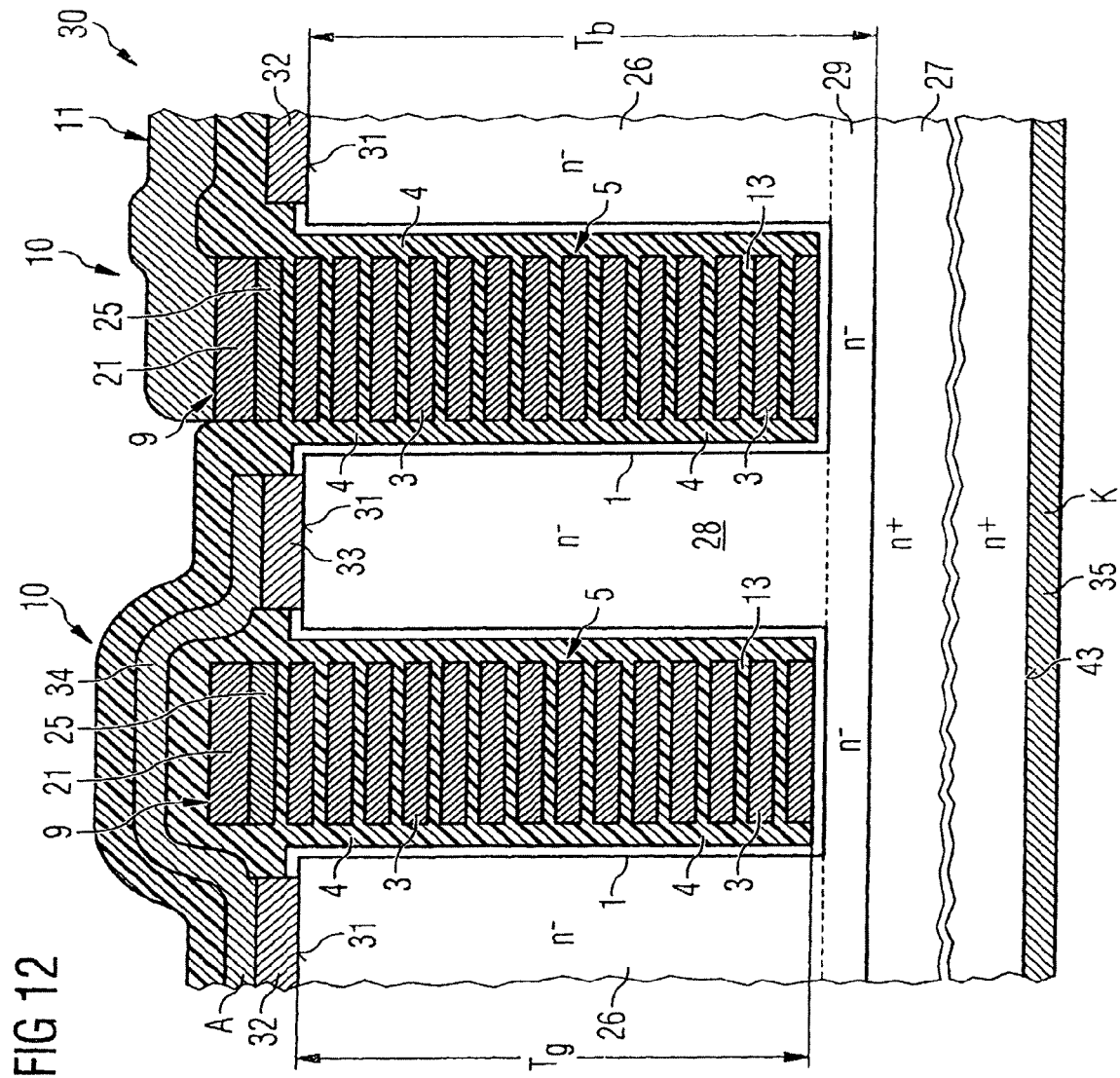
FIG. 12 shows a schematic cross section through a cell of a Schottky diode with capacitor structure.

FIG. 12 shows a schematic cross section through a cell 28 of a Schottky diode 30 with capacitor structure 10. The capacitor structure 10 is embedded in a weakly doped semiconductor body region 26 of the conduction type $n^-$. The weakly doped semiconductor body region 26 has a thickness $T_b$ and forms cells 28 that are surrounded by the capacitor structure 10 as far as a depth $T_g$. Since the thickness $T_b$ of the weakly doped semiconductor body region 26 in this embodiment of the invention is preferably greater than the depth $T_g$ of the trench structure 1, a buffer layer 29 is produced for example between the capacitor structure 10 and the highly doped substrate 27.

In the case of this Schottky diode structure 30, the capacitor structure 10 surrounds a multiplicity of cells 28 comprising the weakly doped semiconductor body region 26. The top sides of the cells 28 have a metal coating of a Schottky contact material 32. The Schottky contact material 32 forms individual electrodes 33 of a Schottky diode 30, the individual electrodes 33 of the multiplicity of cells 28 being electrically connected in parallel to form an overall electrode 34. The counterelectrode 35 is formed by the highly doped substrate 27 of the same conduction type as the weakly doped semiconductor body 26. In the embodiment of a Schottky diode 30 that is shown, the cells 28 and the buffer layer 29 are thus formed by an $n^-$-type semiconductor material and the highly doped substrate 27 has an $n^+$ conduction type. In that case, the counterelectrode 35 is a cathode K and the overall electrode 34 is an anode A.

Figure 13:
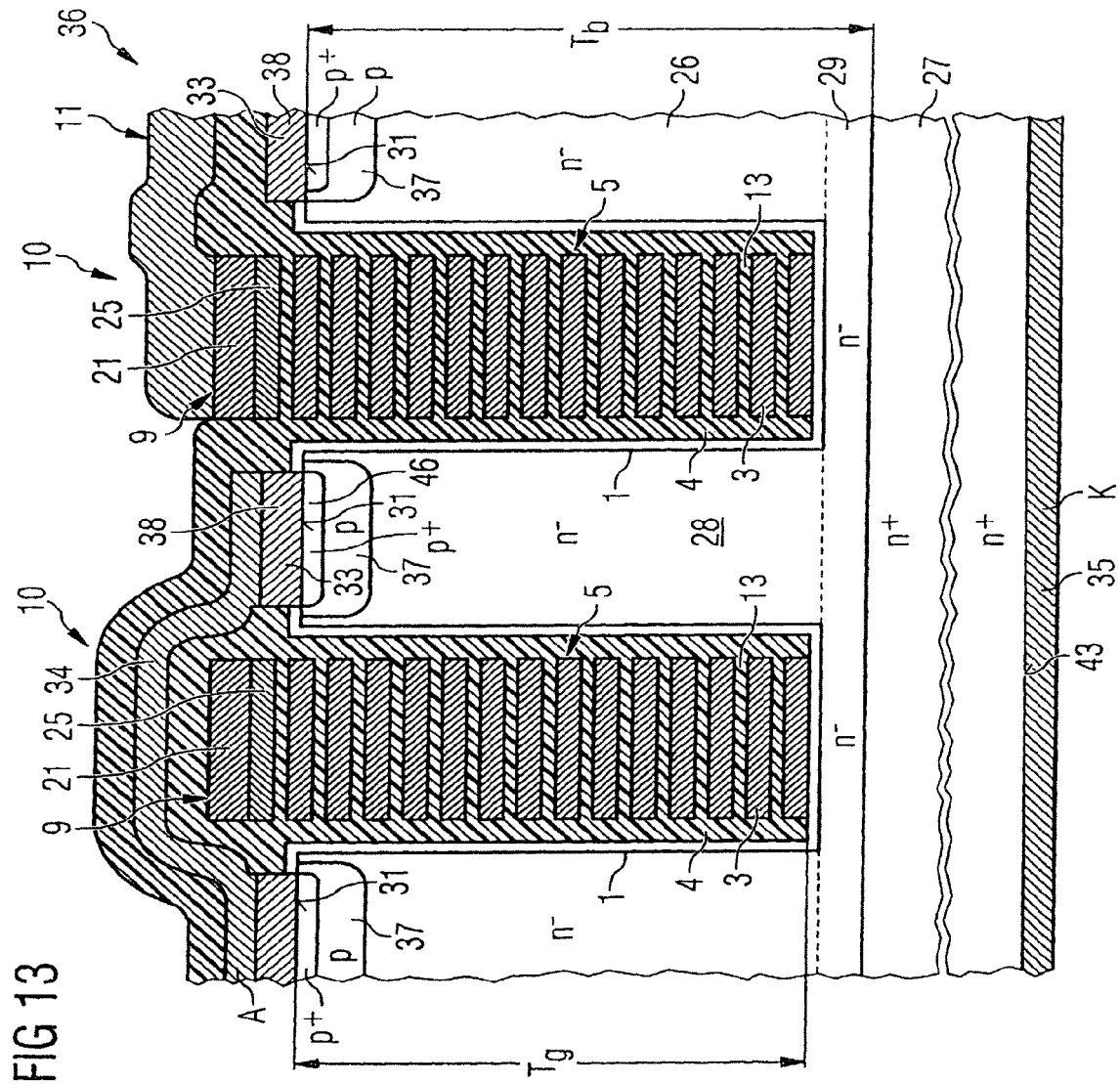
FIG. 13 shows a schematic cross section through a cell of a PN diode with capacitor structure.

FIG. 13 shows a schematic cross section through a cell 28 of a PN diode 36 with capacitor structure 10. This PN diode 36 differs from the Schottky diode structure of FIG. 12 by virtue of the fact that, in the top side region 31, a medium-doped p-type defect well is provided as diffusion zone 37 in this embodiment of the PN diode structure 36, the diffusion zone forming a p-doped defect well 39. At its top side, the p-doped defect well 39 has a highly doped $p^+$-type defect island 46, which forms an ohmic contact with an individual metal electrode 38. Each of the cells 28 of this PN diode structure 36 has an individual ohmic metal electrode 38. These individual electrodes 33 are connected together to form an overall electrode 34, which then form an anode terminal A. The space charge zone between the medium-doped p-type diffusion zone 37 and the weakly doped $n^-$-type region of the cells 28 of the semiconductor body region 26 enables a high reverse voltage for this PN diode structure 26 and has an improved switching robustness compared with conventional PN diodes 36, since the capacitor structure 10 according to the invention enables a higher doping of the $n^-$-type region by more than a factor of 10 compared with homogeneously doped components.

Figure 14:
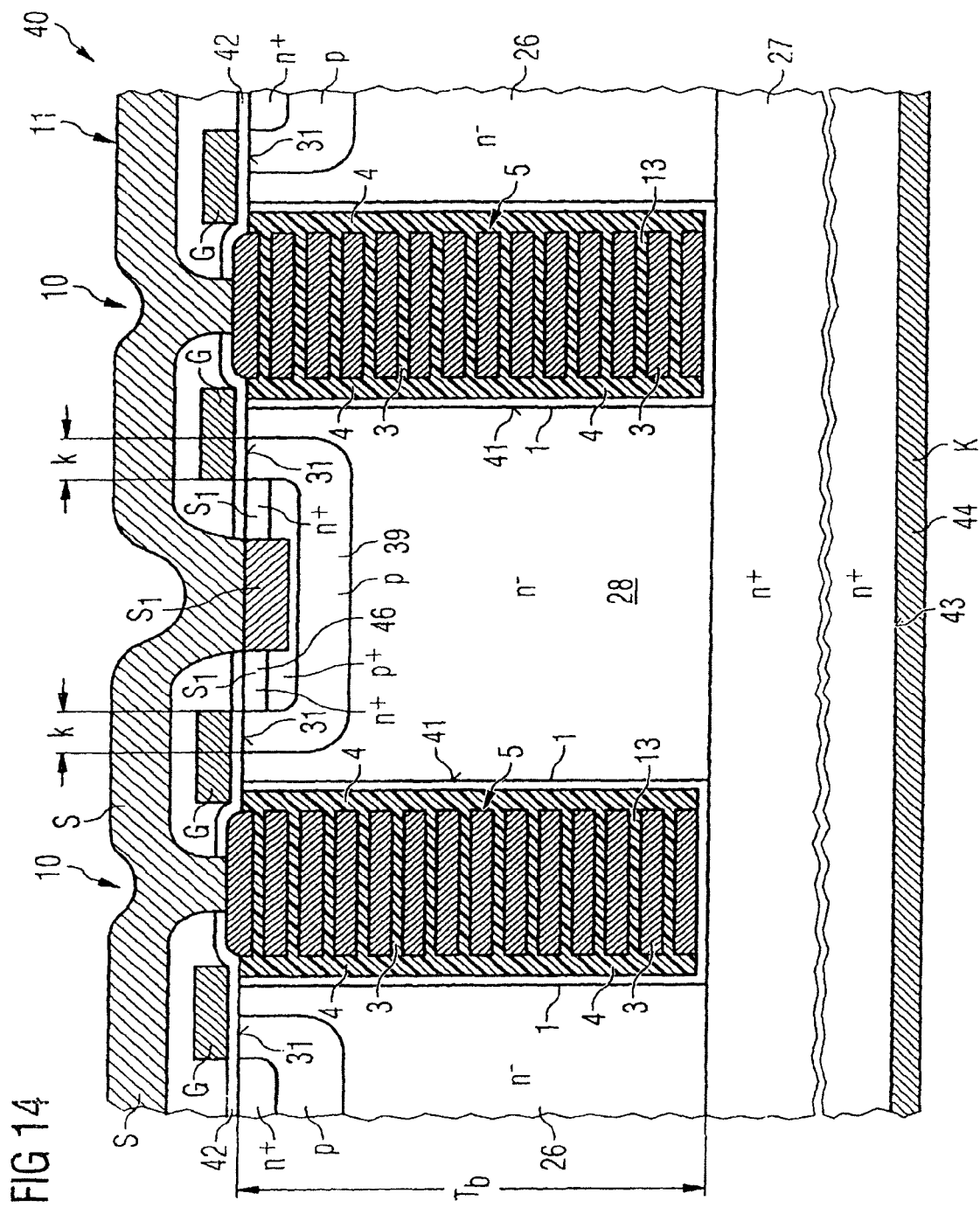
FIG. 14 shows a schematic cross section through a cell of a MOS power transistor with capacitor structure.

FIG. 14 shows a schematic cross section through a cell 28 of a MOS power transistor 40 with capacitor structure 10. For this purpose, the capacitor structure 10 is embedded in a weakly doped semiconductor body region 26 of an n⁻ conduction type. The weakly doped semiconductor body region 26 is arranged on a highly doped substrate 27 of the same conduction type. In this case, the capacitor structure 10 surrounds a multiplicity of cells 28 of the weakly doped semiconductor body region 26. The top side regions 31 of the cells 28 each have a MOS structure with individual source electrodes $S_1$ and individual gate electrodes G. For this purpose, a medium-doped defect well 39 of an opposite conduction type is arranged in the top side region 31 of the cell 28. This p conduction type forms a gate channel region k towards the edge region 41 of the cell 28. A highly doped n⁺-type defect island 46 of the same conduction type as the weakly doped semiconductor body region 26 of the cell 28 is arranged within the defect well 39. The defect island 46 has an individual source electrode $S_1$. The multiplicity of individual source electrodes $S_1$ of the cells 28 are electrically connected in parallel to form a common source electrode S. Moreover, they are electrically connected to the capacitor structure 10. By contrast the gate channel region k is covered by a gate oxide 42 in the edge region 41 of the cell 28 and has individual gate electrodes G. The multiplicity of individual gate electrodes G of the cells 28 are connected together to form a common gate electrode G above the top side 31 of the weakly doped semiconductor body region 26.

On the underside 43 of the high-voltage-resistant MOS power transistor structure 40, a metal coating 44 is arranged on the highly doped substrate 27 of the same conduction type as the weakly doped semiconductor body region 26, the metal coating serving as a large-area drain electrode D. Via the capacitor structure 10, the forward resistances can be reduced in the case of this semiconductor device 11, too, especially as, in the weakly doped n⁻-type region, the defect concentration can be increased by a factor of 3 to 10 compared with present-day compensation components on account of the effect of the capacitor structure 10.

Figure 15:
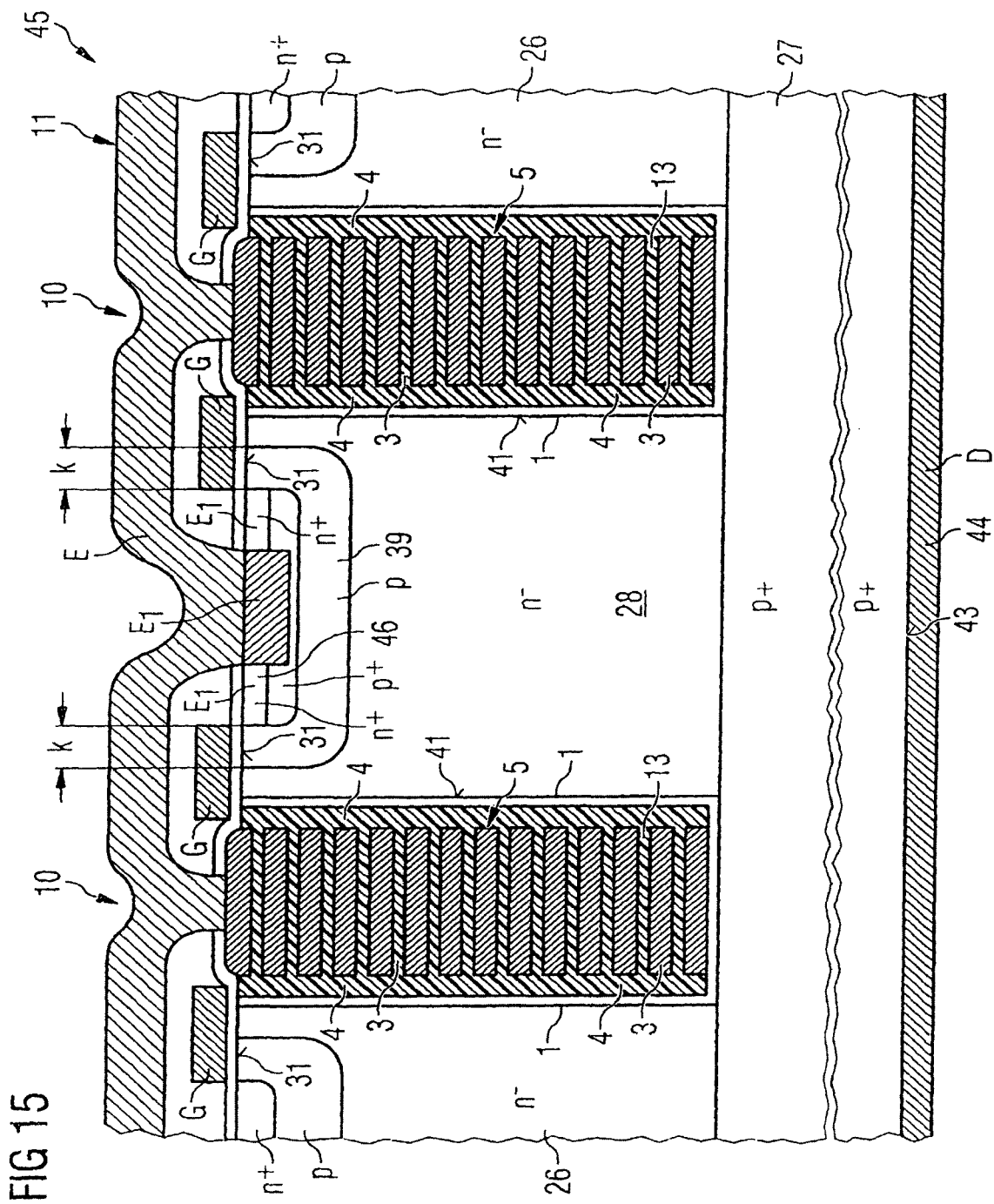
FIG. 15 shows a schematic cross section through a cell of an IGBT power transistor with capacitor structure.
Figure 16:
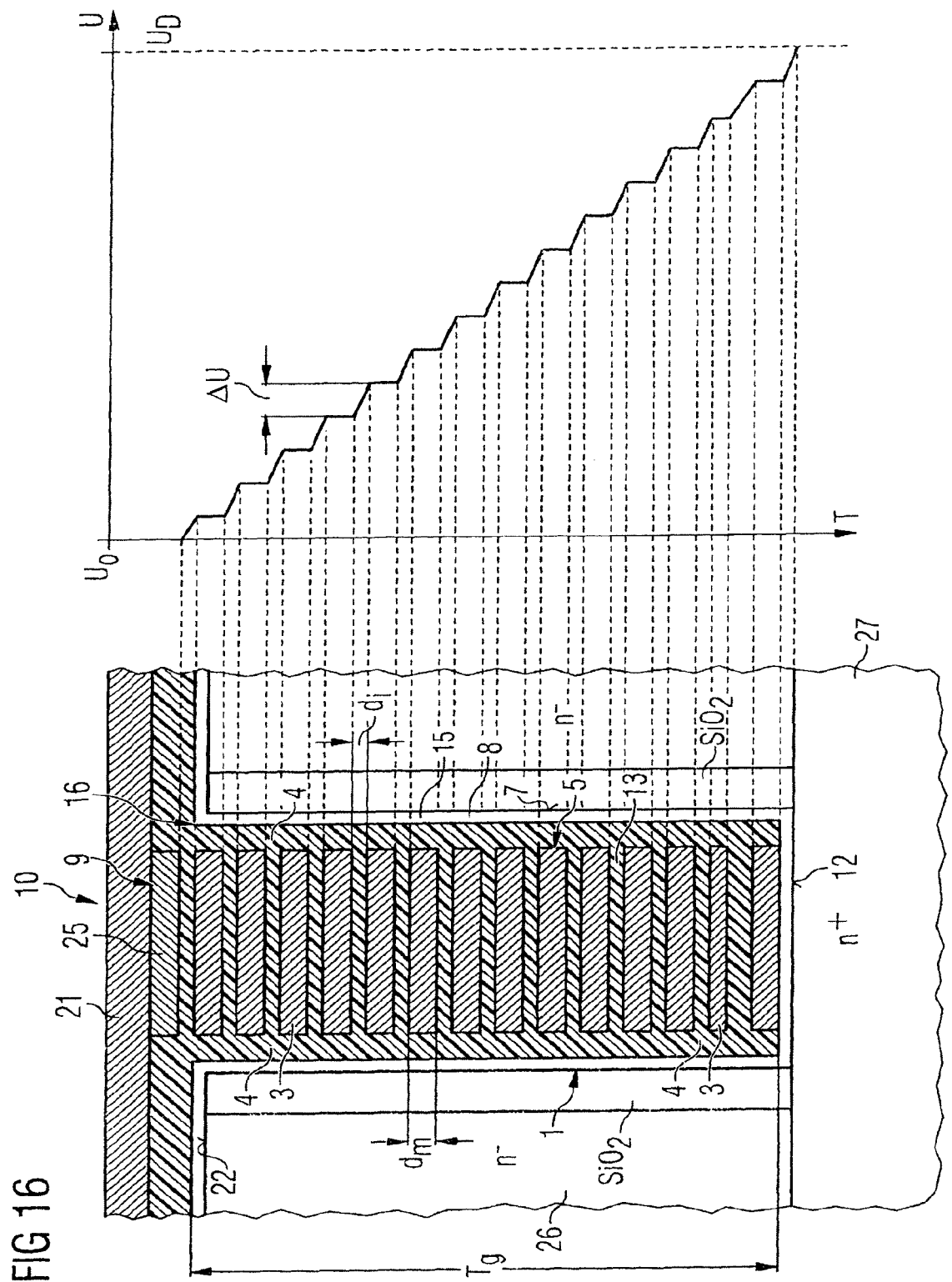
FIG. 16 schematically shows the potential profile for a capacitor structure in accordance with one embodiment of the invention.

FIG. 15 shows a schematic cross section through a cell 28 of an IGBT power transistor 45 with capacitor structure 10. This power transistor structure 45 of an insulated gate bipolar transistor has, on the top side 31 of the cells 28, the same structure as the embodiment of the invention that is shown in FIG. 14. In order to realize a bipolar power transistor, a p⁺-type region is merely provided as a substrate 27, this region adjoining the weakly doped n⁻-type semiconductor body region 26 of the cells 28. All the remaining regions of this embodiment of the invention correspond in terms of their structure and function to the components described in FIG. 14, instead of the individual source electrode an individual emitter electrode $E_1$ now being arranged on each cell 28. The individual emitter electrodes $E_1$ of the cells 28 are connected together via a conduction structure to form a common emitter electrode E. In this embodiment, on the underside 43 of the p⁺-conducting substrate 27, the metal coating 44 forms a large-area collector electrode C instead of a large-area drain electrode.

The semiconductor devices shown with the aid of FIGS. 14 and 15 are based on planar cells for MOS and IGBT semiconductor power devices, respectively, in particular with regard to the construction of the horizontally arranged channel regions. However, the capacitor structure according to the invention may also be used for realizing MOS and IGBT semiconductor power devices which have vertical channel regions in a trench structure with gate oxide and gate electrode.

List of reference symbols
1 Trench structure (first embodiment) or trench
2 Trench structure (second embodiment) or trench
3 Conductive region or conductive layer
4 Dielectric or insulation layer or insulating layer
5 Stacked layers
6 Conductive layer material
7 Trench wall or wall
8 Coating of the trench walls
9 Layered capacitor
10 Capacitor structure (first embodiment)
11 Semiconductor device
12 Bottom of the trench structure
13 Dielectric intermediate layer
14 Protective layer
15 Wall protection
16 Entrance of the trench structure
17 Undercut
18 Conductive layer (first layer)
19 Conductive layer (second layer)
20 Capacitor structure (second embodiment)
21 Electrode
22 Top side
23 Wall insulation layer (first layer)
24 Wall insulation layer (second layer)
25 Topmost conducting layer
26 Weakly doped semiconductor body region
27 Highly doped substrate
28 Cell
29 Buffer layer
30 Schottky diode or Schottky diode structure
31 Top side of the cell or top side region
32 Schottky contact material
33 Individual electrode
34 Overall electrode
35 Counterelectrode
36 PIN diode structure or PIN diode
37 Diffusion zone
38 Metal electrode (individual)
39 Medium-doped defect well
40 MOS power transistor structure or MOS power transistor
41 Edge region of the cell
42 Gate oxide
43 Underside
44 Metal coating
45 IGBT power transistor structure or IGBT power transistor
46 Highly doped defect island
50 Capacitor structure (second embodiment)
60 Capacitor structure (third embodiment)
A Anode
K Cathode
D Drain electrode
G Gate electrode
S Source electrode
$S_1$ Individual source electrode
k Gate channel distance or gate channel region
C Collector electrode
E Common emitter electrode
$E_1$ Individual emitter electrode
$d_i$ Thickness of the insulation layer
$d_{i1}$ Thickness of the insulation layer (first layer)
$d_{i2}$ Thickness of the insulation layer (second layer)
$d_m$ Thickness of the conductive layer
$d_{m1}$ Thickness of the conductive layer
$d_{m2}$ Thickness of the conductive layer (second layer)
$d_{ma}$ Initial thickness of the conductive layer
$T_g$ Trench depth $T_b$ Thickness of the weakly doped semiconductor body region
n Conduction type
p Opposite conduction type

What is claimed is:

1. A method for fabricating a layered capacitor of a semiconductor device, the method comprising:
   a) isotropically oxidizing and/or nitriding walls of a trench structure to provide wall protection;
   b) anisotropically depositing a conductive material in the trench structure, a deposition rate at the walls being lower than at a bottom of the trench structure at least by at least a factor of two;
   c) depositing a dielectric material in the trench structure on the conductive material, such that a deposition rate at the walls is lower than at the bottom of the trench structure;
   d) producing a selective protective layer on a layer made of the dielectric material at the bottom of the trench structure;
   e) etching-back a layer sequence deposited on the walls up to the wall protection; and
   f) repeating b) to e) until the trench structure is filled.

2. The method of claim 1, wherein undercuts of the capacitor structure formed by e) are filled by dielectric material.

3. The method of claim 1, wherein deposition parameters during the anisotropic application of conductive and/or dielectric material, for the purpose of setting different layer thicknesses ($d_m$, $d_i$), are varied in accordance with a predetermined potential profile in the stacking direction of the layered capacitor.

4. The method of claim 1, wherein etching-back with protection of the layer stack already formed is interposed when overhangs of deposited material are formed at an entrance to the trench structure.

5. The method of claim 1, wherein a) includes oxidizing in an oxygen and/or water vapor atmosphere.

6. The method of claim 1, wherein a) includes performing chemical vapor deposition the isotropic nitriding of the walls of the trench structure.

7. The method of claim 1, wherein b) includes sputtering.

8. The method of claim 1, wherein b) includes a directional vapor deposition.

9. The method of claim 1, wherein b) includes a directional ion beam deposition from a plasma.

10. The method of claim 1, further comprising removing the protective layer via plasma incineration.

11. The method of claim 1, wherein a photolithography method is performed for a masked application of the protective layer.

* * * * *